United States Patent
Lai et al.

(10) Patent No.: US 10,833,668 B2
(45) Date of Patent: Nov. 10, 2020

(54) INTEGRATED AND DISTRIBUTED OVER TEMPERATURE PROTECTION FOR POWER MANAGEMENT SWITCHES

(71) Applicant: Analog Devices International Unlimited Company, Co. Limerick (IE)

(72) Inventors: Chiong Yew Lai, Singapore (SG); Javier A. Salcedo, North Billerica, MA (US)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/295,447

(22) Filed: Mar. 7, 2019

(65) Prior Publication Data

US 2020/0287530 A1    Sep. 10, 2020

(51) Int. Cl.
*H03K 17/0812* (2006.01)
*H03K 17/08* (2006.01)

(52) U.S. Cl.
CPC .................. *H03K 17/08122* (2013.01); *H03K 2017/0806* (2013.01)

(58) Field of Classification Search
CPC ............. H03K 17/00; H03K 17/04123; H03K 17/063; H03K 17/08122; H03K 17/168; H03K 17/687; H03K 17/6874; H03K 2017/00; H03K 2017/0806
USPC ....................................................... 327/434
See application file for complete search history.

(56) References Cited

U.S. PATENT DOCUMENTS

| | | | |
|---|---|---|---|
| 5,686,858 A | 11/1997 | Malherbe | |
| 5,737,169 A | 4/1998 | Sellers | |
| 5,914,629 A | 6/1999 | Maki | |
| 6,112,525 A * | 9/2000 | Yoshida | ................. F25B 21/02 62/3.2 |
| 6,137,165 A | 10/2000 | Thierry | |
| 6,812,722 B2 | 11/2004 | Throngnumchai et al. | |
| 6,876,043 B1 | 4/2005 | Sander | |
| 7,078,954 B2 | 7/2006 | Watanabe | |

(Continued)

FOREIGN PATENT DOCUMENTS

| | | |
|---|---|---|
| CN | 204031117 | 12/2014 |
| CN | 204244103 | 4/2015 |

(Continued)

OTHER PUBLICATIONS

Monolithically Integrated Temperature Sensor in Silicon Carbide Power MOSFETs MaximeBerthou, Philippe Godignon, and Josóe Millóan, IEEE Transactions on Power Electronics, Vol. 29, No. 9, Sep. 2014 (8 pages).

*Primary Examiner* — Lincoln D Donovan
*Assistant Examiner* — Dave Mattison
(74) *Attorney, Agent, or Firm* — Knobbe, Martens, Olson & Bear, LLP

(57) ABSTRACT

A plurality of lower voltage metal oxide semiconductor sensors are integrated and distributed in various parts of a power MOSFET to provide over temperature protection. The sensors are sensitive to temperatures of the various parts of the power MOSFET and configured to regulate the power MOSFET when a trip temperature is reached by reducing the operation of the MOSFET. A bias network is configured to set the trip temperature. In some configurations, a threshold voltage is used to monitor and control the maximum temperature.

21 Claims, 17 Drawing Sheets

(56) References Cited

U.S. PATENT DOCUMENTS

| | | | |
|---|---|---|---|
| 2004/0184510 A1 | 9/2004 | Tokunaga | |
| 2010/0213919 A1 | 8/2010 | Takayanagi et al. | |
| 2012/0257648 A1* | 10/2012 | Jeong | G01K 7/00 |
| | | | 374/163 |
| 2015/0030051 A1* | 1/2015 | Cortigiani | H02H 3/07 |
| | | | 374/137 |
| 2015/0071323 A1* | 3/2015 | Lee | G06K 9/0002 |
| | | | 374/45 |
| 2015/0364524 A1* | 12/2015 | Kadow | H01L 29/7826 |
| | | | 327/512 |

FOREIGN PATENT DOCUMENTS

| | | |
|---|---|---|
| CN | 106887670 | 6/2017 |
| CN | 103840434 | 8/2017 |
| CN | 107733404 | 2/2018 |
| CN | 108461617 | 8/2018 |
| JP | 2002-344296 | 11/2002 |
| JP | 4594633 | 12/2010 |
| JP | 2011-137714 | 7/2011 |
| JP | 2015-070621 | 4/2015 |

* cited by examiner

INTEGRATED AND DISTRIBUTED OVER TEMPERATURE PROTECTION FOR POWER MANAGEMENT SWITCHES

FIELD

This disclosure relates to over temperature protection for semiconductor switches, in particular switches for power management applications.

BACKGROUND

Power switches, such as power metal oxide semiconductor field effect transistors (MOSFETs) are widely used to control the transfer and conversion of power in electrical systems. In high voltage applications, a power MOSFET switching from off-state to on-state can enter the saturation mode and experience self-heating. In high current applications, self-heating can cause a significant and rapid rise in die temperature that can damage or destroy the power MOSFET.

To prevent damaging or destructive self-heating, power switches can be rated with a Safe Operating Area (SOA) curve. However, user compliance with the SOA curve is not guaranteed, leaving device operation at risk. Also, overly conservative SOAs are often provided for power switches, leaving thermal headroom underutilized.

SUMMARY

Integrated sensors and regulators can provide a power switch with more robust protection against self-heating and are less susceptible to user misuse. The sensors can detect a temperature of the power switch and limit the operation of the power switch to keep the temperature at safe levels. This disclosure describes an integrated and distributed over temperature protection system for power switches. Various embodiments can provide more robust over temperature protection, more accurate over temperature protection, over temperature protection for more discrete areas, and/or be implemented using smaller areas of semiconductor.

In one aspect, a power delivery system with built-in, distributed over temperature detection is provided. The power delivery system includes a power metal oxide semiconductor field effect transistor (MOSFET) on a semiconductor substrate and configured to deliver power from a power source, and a plurality of metal oxide semiconductor (MOS) sensors distributed within an area of the semiconductor substrate outlined by the power MOSFET. The MOS sensors include a first MOS sensor having a threshold voltage configured to change conductivity based on a first temperature of a first local portion of the power MOSFET, and a second MOS sensor having a second threshold voltage configured to change conductivity based on a second temperature of a second local portion of the power MOSFET.

In another aspect, a switch with distributed over temperature protection for local regions is provided. The switch includes a power metal oxide semiconductor field effect transistor (MOSFET) on a semiconductor substrate, and a plurality of n-type metal oxide field effect (nMOS) transistors distributed within an area of the semiconductor substrate outlined by the power MOSFET. Each of the nMOS transistors has a drain that is electrically coupled to a gate of the power MOSFET.

In another aspect, a method of power distribution with over temperature protection is provided. The method includes controlling power delivery to a load using a power metal oxide semiconductor field effect transistor (MOSFET) having a layout formed on a semiconductor substrate, and detecting an over temperature condition using a plurality of distributed metal oxide semiconductor (MOS) sensor transistors integrated in the layout of the power MOSFET in the semiconductor substrate. The plurality of MOS sensor transistors include a first MOS sensor transistor and a second MOS sensor transistor, and detecting the over temperature condition includes changing a threshold voltage of the first MOS sensor transistor in response to a change in temperature of a first region of the layout of the power MOSFET, and changing a threshold voltage of the second MOS sensor transistor in response to a change in temperature of a second region of the layout of the power MOSFET.

Some aspects feature a power switch protected from localized overheating, the power switch comprising: a power metal oxide semiconductor field effect transistor (MOSFET) on a semiconductor substrate configured to conduct power from a power source; a plurality of metal oxide semiconductor (MOS) sensors distributed within an area of the semiconductor substrate outlined by the power MOSFET, the MOS sensors having threshold voltages affected by temperatures of two or more different areas of the power MOSFET, and wherein the MOS sensors are biased with a voltage that is substantially constant during operation of the power MOSFET; and a conductor coupled to a gate of the power MOSFET and to drains of the MOS sensors, wherein a voltage on the conductor is configured to change when at least one of the MOS sensors conducts in response to reaching a trip temperature.

Figure 1A:
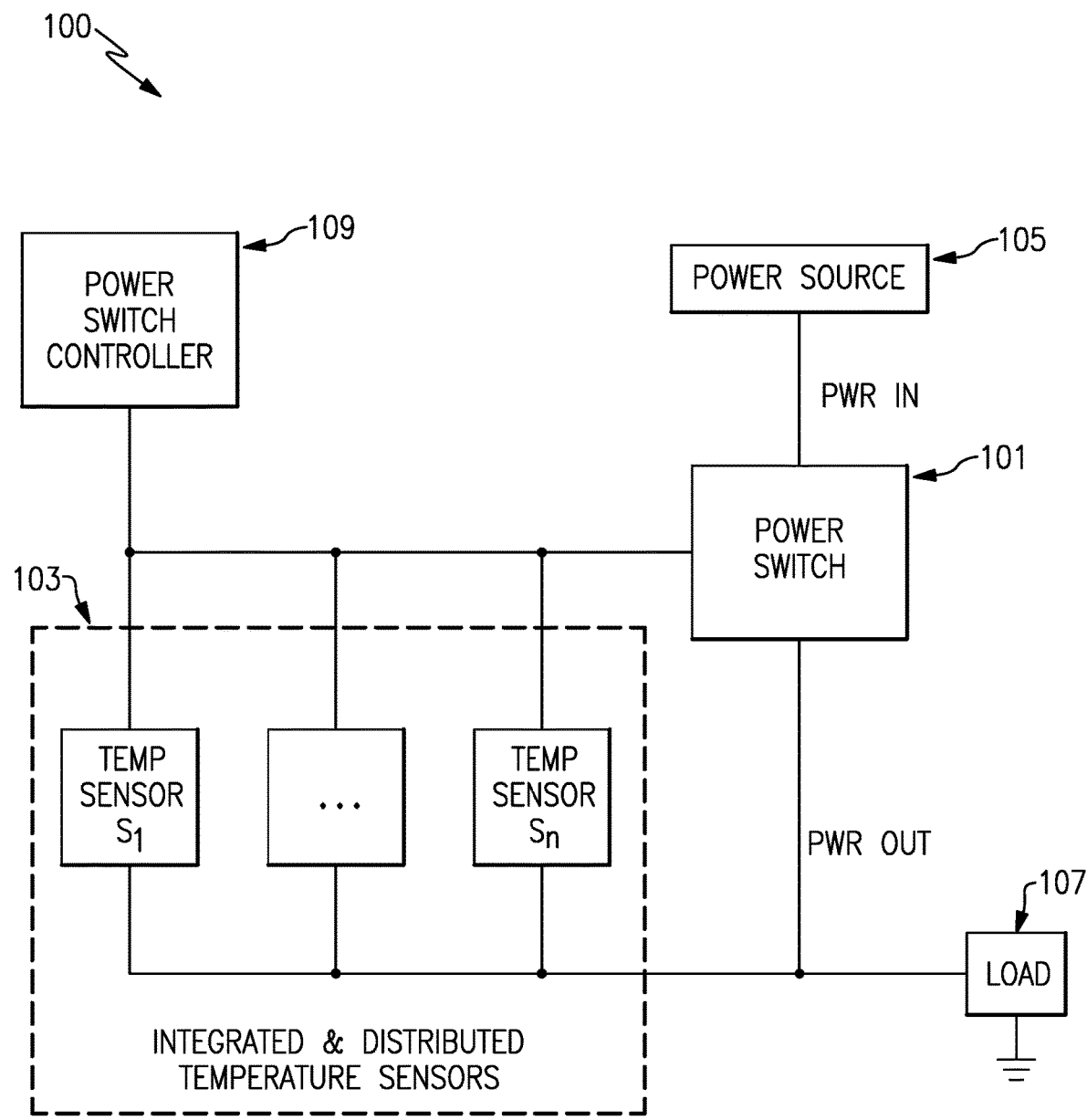
FIG. 1A shows a block diagram of an example system including integrated and distributed temperature sensors for a power switch.

Elements in the drawings are not necessarily drawn to scale. Some features may be made larger or smaller for clarity and/or emphasis.

DETAILED DESCRIPTION

Introduction

When the power dissipated by a power MOSFET is sufficiently large, runaway overheating can occur. Inherent mismatches within the power MOSFET's layout can cause certain parts of the power MOSFET to carry more current and heat up more relative to other parts of the power MOSFET. When a power MOSFET operates in saturation mode, a drop in a hotter part's threshold voltage, which has a negative temperature coefficient, induces the hotter part to conduct more current and form a local hotspot, eventually destroying the power MOSFET.

Solutions relying solely on an average temperature of the whole power MOSFET provide insufficient protection against overheating at local hotspots. Stochastic physical conditions can govern the occurrence of local hotspots. A local hotspot can heat up quickly and reach destructive temperatures well before an average temperature of the power MOSFET begins to indicate overheating problems.

Advanced process technologies increasingly integrate higher quantities of features, allowing for designs of more complex integrated circuits. However, tighter technology fabrication and operational rules have developed alongside the higher feature count, including limits on local operational temperatures. Prompt detection and regulation of overheating can be more critical to preserving the operation of these devices. External, non-integrated temperature sensors and response systems may not detect or respond to overheating conditions quickly enough.

Figure 2A:
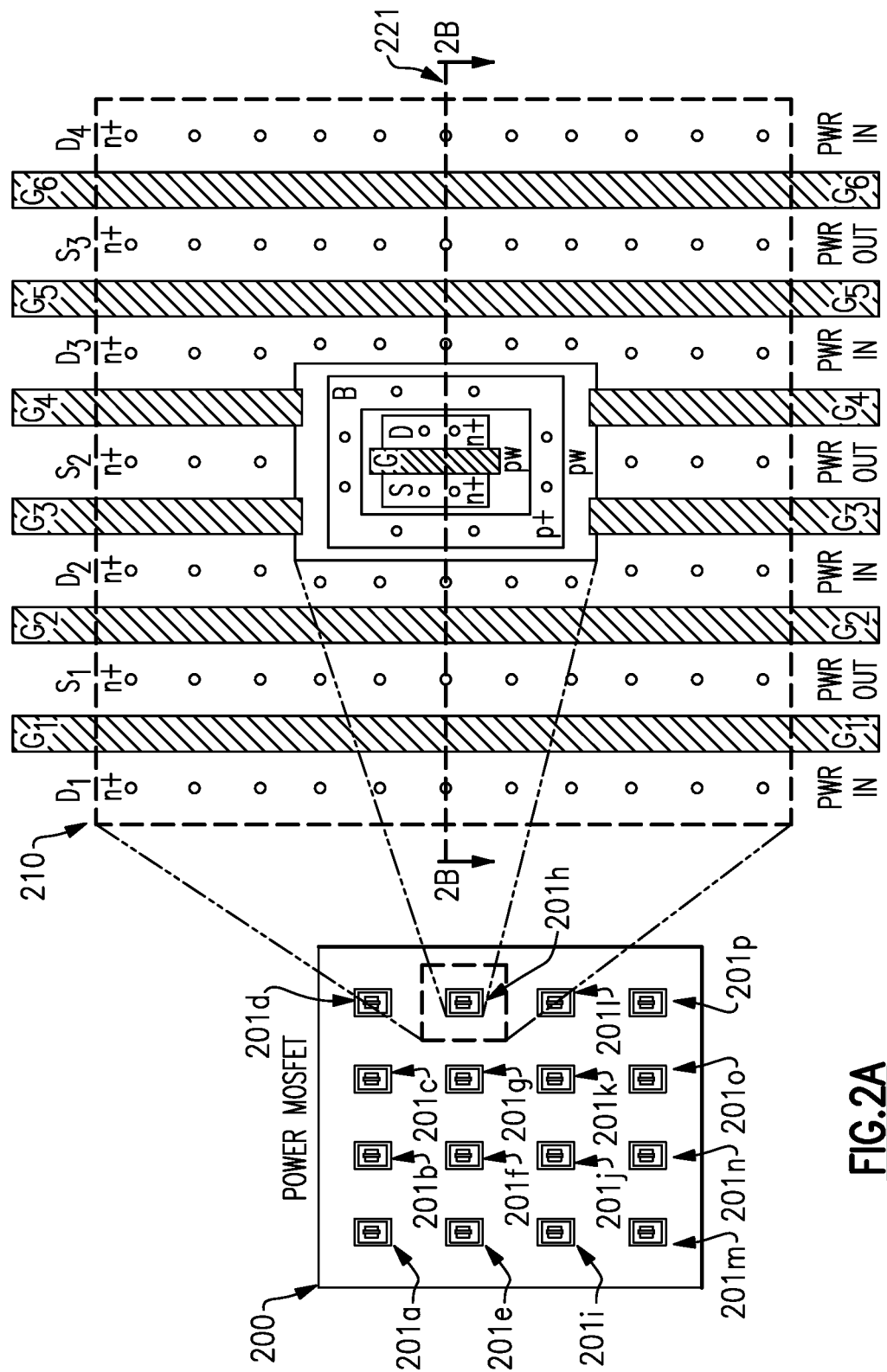
FIG. 2A shows a layout view of an example n-type power MOSFET with a plurality of integrated and distributed nMOS sensors and corresponding expanded layout view.

A more robust protection system against localized overheating is disclosed herein. To timely detect a rise in local temperature at a local hotspot early enough to save the larger power MOSFET from damage and/or destruction, a plurality of smaller, lower voltage metal oxide semiconductor transistors are integrated and distributed in various parts of the larger, higher voltage power MOSFET, for example, as shown in FIG. 2A and FIG. 3B. The lower voltage MOSFET transistors are sensitive to temperature changes and will be referred to as MOS sensors.

The MOS sensors are coupled in a way to regulate the power MOSFET when a trip temperature ($T_{trip}$) is reached, such as by diverting current away from the gate of an n-type power MOSFET, thereby lowering the voltage of the gate of the n-type power MOSFET to reduce and/or stop the operation of the n-type power MOSFET, for example, using the designs shown in FIG. 1B through FIG. 2B and FIG. 9. The system polarity can also be reversed and implemented with p-type power MOSFETs, for example, using the designs shown in FIG. 3A through FIG. 3C. The trip temperature can be set by biasing the MOS sensors to adjust a threshold voltage ($V_{Th}$) of the MOS sensors, such as according to the relationship shown in FIG. 4. Some examples of circuit level operation are described with respect to FIG. 1B-1D, FIG. 3A, FIG. 8, and FIG. 9.

By being integrated and distributed in various parts of the power MOSFET, the MOS sensors can protect against overheated local hotspots within the power MOSFET and not just protect based on an average temperature of the whole power MOSFET. By being integrated with and coupled to the power MOSFET, the MOS sensors are also able to more quickly respond to temperature changes in comparison to temperature control circuits implemented outside of the power MOSFET.

In some designs described herein, the MOS switches do not occupy any additional semiconductor area outside of the power MOSFET. In some designs, the power MOSFET can remain the same or similar size with little or no impact on the performance of the power MOSFET. Accordingly, the designs for temperature protected power MOSFETs described herein may occupy a same, similar, or only slightly larger size with little or no impact on performance in comparison to other power MOSFETs.

Furthermore, the designs described herein can use a connection to a gate of a power MOSFET and cause little or no additional impact on metallization. In some cases, the performance of the power MOSFET can be improved due to increased and/or more efficiently utilized thermal design power (TDP) allowed by more responsive and accurate temperature regulation.

Some designs disclosed herein also allow for detection of over temperature conditions using an existing connection to the power MOSFET, such as a connection to the gate of the power MOSFET, without additional connections. An over temperature condition can be sensed with or without an additional, separate electrical connection to the power MOSFET.

Example Block Diagram

FIG. 1A shows a block diagram of an example system 100 including integrated and distributed temperature sensors 103 for a power switch 101. The system 100 includes the power switch 101, a plurality of integrated and distributed temperature sensors 103 including temperature sensors $S_1$ through $S_n$, a power source 105, a load 107, and a power switch controller 109.

Power from the power source 105 is provided through the power switch 101 to the load 107. As power is transferred through the power switch 101, parts of the power switch 101 may increase in temperature. The power switch controller 109 is configured to control the operation of the power switch 101, such as by adjusting a gate voltage of the power switch 101.

The plurality of integrated and distributed temperature sensors 103 are located at different areas of the power switch 101, for example, as further illustrated in FIG. 2A. With respect to FIG. 1A, the temperature sensors $S_1$ through $S_n$ are affected by the local temperatures of the different areas of the power switch in which the temperature sensors $S_1$ through $S_n$ are located. As further discussed with respect to FIG. 4, changes in temperature affect the threshold voltage of the temperature sensors $S_1$ through $S_n$, causing changes in the conductive states of the temperature sensors $S_1$ through $S_n$. The threshold voltage is the gate to source voltage ($V_{GS}$) at which a channel starts to form in the MOS sensor, thereby leading to channel current conduction. Accordingly, temperature sensors $S_1$ through $S_n$ can detect local overheating of parts of the power switch 101. In response to the overheating, the operation of the power switch 101 can be reduced and/or stopped.

In various embodiments, the power switch 101 can be a p-type or n-type power MOSFET switch. In various embodiments, the temperature sensors $S_1$ through $S_n$ can be p-type or n-type MOS sensors. The conductivity type of the MOS sensors and the power MOSFET can be the same (e.g., both n-type or both p-type). The power MOSFET can be configured and rated for higher voltage operation than the MOS sensors.

Example nMOS Circuit Diagrams

Figure 1B:
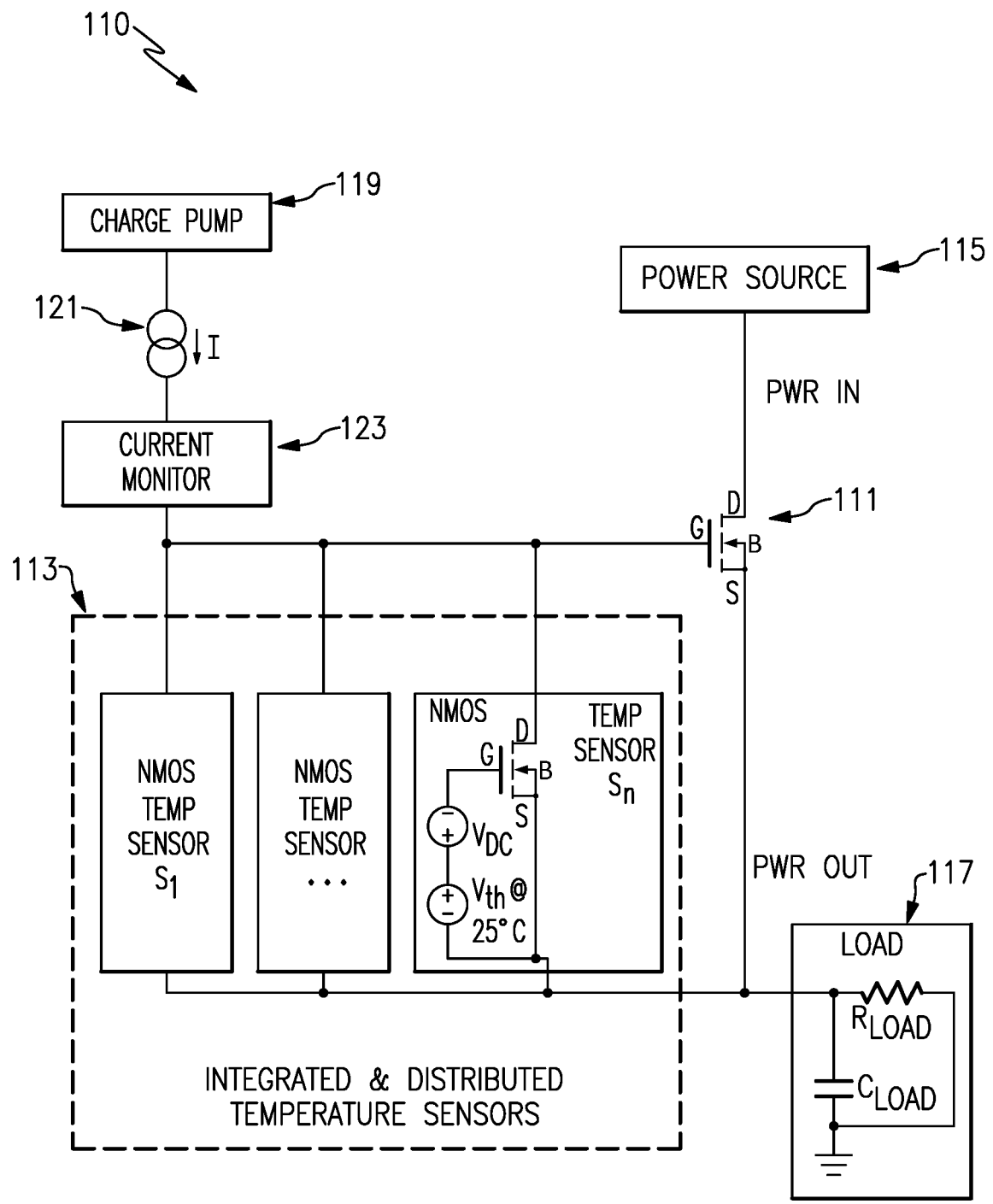
FIG. 1B shows a block diagram of an example system including an integrated and distributed nMOS sensor over temperature regulation system for a power MOSFET.

FIG. 1B shows a block diagram of an example system 110 including integrated and distributed nMOS sensors 113 for an n-type power MOSFET 111. The system 110 includes the power MOSFET 111, the integrated and distributed nMOS sensor over temperature regulation system 113 including a plurality of temperature sensors $S_1$ through $S_n$, a power source 115, a load 117, a charge pump 119, a current source 121, a current monitor 123, and a gate to source voltage ($V_{GS}$) bias network including voltage sources $V_{DC}$ and $V_{th@25°C}$.

The power MOSFET 111 has its body coupled to its source. The power MOSFET 111 is configured to receive, at its drain, power from the power source 115 and provide an output power at its source to the load 117. The power MOSFET 111 can be turned on by providing a sufficiently high voltage to its gate. In some embodiments, the power MOSFET 111 can be a laterally diffused MOSFET (LD-MOS).

The integrated and distributed nMOS sensor over temperature regulation system 113 can include a plurality of nMOS sensors $S_1$ through $S_n$ that are integrated and distributed across different parts of the power MOSFET 111. The drains of the nMOS sensors $S_1$ through $S_n$ are coupled to the gate of the power MOSFET 111. The sources of the nMOS sensors $S_1$ through $S_n$ can be coupled to the source of the power MOSFET 111. The sources of the nMOS sensors $S_1$ through $S_n$ can be coupled to the bodies of the nMOS sensors $S_1$ through $S_n$.

The gates of the nMOS sensors $S_1$ through $S_n$ are biased with respect to the sources ($V_{GS}$) such that the nMOS sensors $S_1$ through $S_n$ are off and nonconductive at normal operating temperatures. The $V_{GS}$ of the nMOS sensors $S_1$ through $S_n$ is also biased to control the trip temperature ($T_{trip}$) at which the nMOS sensors $S_1$ through $S_n$ begin to turn on, which is further discussed with respect to FIG. 4.

Figure 8:
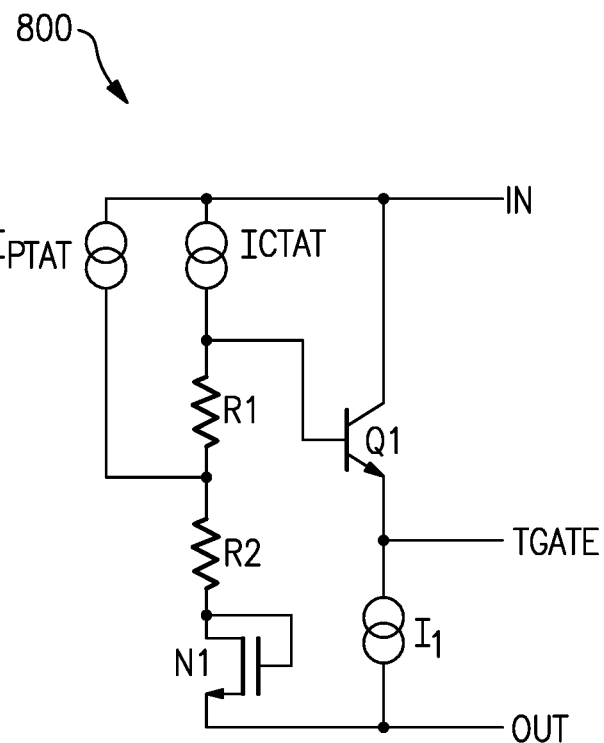
FIG. 8 shows an example circuit for generating a reference voltage.

The $V_{GS}$ bias network of the nMOS sensor $S_n$ is represented as two voltage sources, $V_{DC}$ and $V_{th@25°C}$. $V_{th@25°C}$ represents the threshold voltage of the nMOS sensor $S_n$ at 25° C. Although the disclosure is discussed with respect to a threshold voltage at 25° C. to better aid reader comprehension by discussing a consistent temperature example, it will be understood that the threshold voltage can be made with reference to any higher or lower temperature and is not limited to 25° C. $V_{DC}$ is a direct current biasing voltage which can be adjusted to control the temperature at which the drain current of the nMOS sensor $S_n$ turns on to start pulling down the gate of the power MOSFET 111. $V_{DC}$ can be a fixed or variable voltage source. In some embodiments, $V_{DC}$ and $V_{th@25°C}$ can be separated. In some embodiments, $V_{DC}$ and $V_{th@25°C}$ can be combined as one voltage source or reference voltage providing the trip voltage ($V_{trip}$) that corresponds to the trip temperature $T_{trip}$. FIG. 8 provides an example circuit operable to provide the $V_{th@25°C}$ voltage derived from a MOSFET of the same type as the MOS sensor $S_n$ and further compensated to remain constant over temperature. Although the example $V_{GS}$ bias network is illustrated as part of an individual temperature sensor $S_n$ to allow setting of independent trip temperatures for different temperature sensors, in various embodiments, one $V_{GS}$ bias network can provide a bias voltage to a plurality of the temperature sensors $S_1$ through $S_n$.

As the nMOS sensor $S_n$ heats up, the threshold voltage at which the nMOS sensor $S_n$ begins to conduct will be reduced. When the nMOS sensor $S_n$ is biased with a gate to source voltage $V_{GS}$ corresponding to the trip temperature $T_{trip}$ and the local temperature of the power MOSFET 111 around the nMOS sensor $S_n$ causes the temperature of the nMOS sensor $S_n$ to reach the trip temperature $T_{trip}$, the nMOS sensor $S_n$ will begin to conduct. When conducting, the nMOS sensor $S_n$ will pull the gate voltage of the power MOSFET 111 down to the source voltage of the power MOSFET 111. Reducing the gate voltage of the power MOSFET 111 will reduce and/or stop operation of the power MOSFET 111.

Figure 2B:
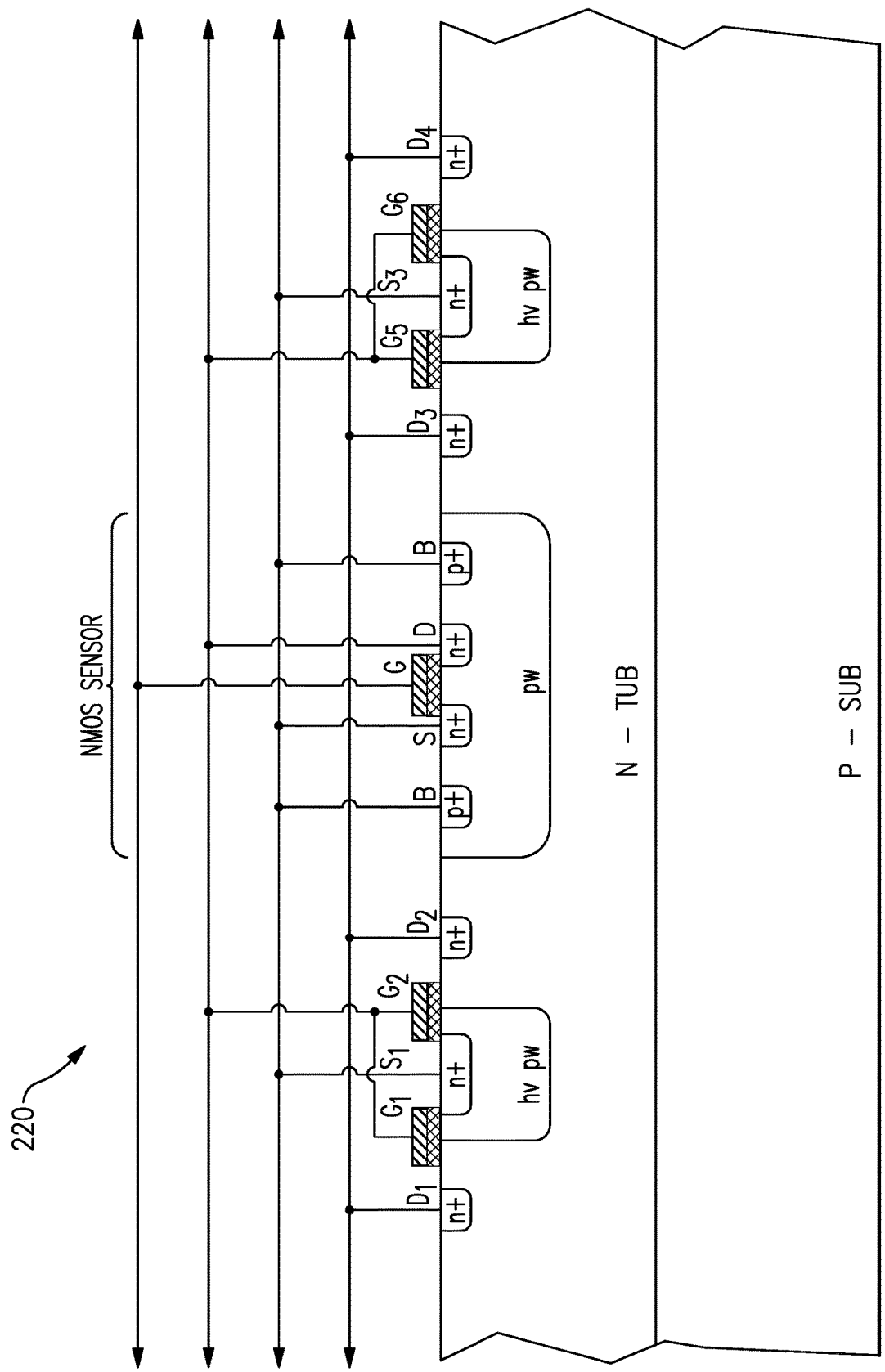
FIG. 2B shows a cross section view of the example n-type power MOSFET of FIG. 2A.

In the topology shown in FIG. 2B, the terminals of the nMOS sensor $S_n$ are biased with voltage levels close to the gate and/or source voltages of the power MOSFET 111. Accordingly, the nMOS sensor $S_n$ can be configured to have a drain-source voltage ($V_{DS}$) rating exceeding the gate-source voltage ($V_{GS}$) rating of the power MOSFET 111. In advanced bipolar, complementary MOS (CMOS), double-diffused MOS (DMOS) process technologies, a low voltage nMOS sensor can be used to satisfy the $V_{DS}$ rating and other design parameters. The low voltage nMOS sensor can be constructed within the power MOSFET 111 with little or no area penalty without affecting the operation of the power MOSFET. Accordingly, many low voltage MOS sensors $S_1$ through $S_n$ can be embedded and distributed within the power MOSFET 111.

The charge pump 119 and current source 121 are configured to provide a current to the gate of the power MOSFET 111 to operate the power MOSFET 111. The current monitor 123 can monitor the current provided by the current source 121 to detect an over temperature condition. If the gate of the power MOSFET 111 is at an operating voltage, then subsequent current flow exceeding a threshold amperage and/or threshold change in amperage caused by at least one nMOS sensor $S_1$ through $S_n$ conducting current can indicate an over temperature condition. In some embodiments, the current monitor 123 can instead be a voltage monitor that is configured to detect a drop in the gate voltage of the power MOSFET 111 below a threshold voltage and/or exceeding a threshold voltage change caused by one or more conducting MOS sensors $S_1$ through $S_n$ as an indication of the over temperature condition. Detection of an over temperature condition by the current monitor 123 and/or voltage monitor can be disabled or ignored before the power MOSFET 111 reaches a steady on state. For example, when the power MOSFET 111 is initially turned on by providing current to its gate G until a gate voltage $V_G$ is reached, parasitic capacitance of the gate G may cause current flow that is not responsive to an over temperature condition. Likewise, if the initial voltage of the gate G of the power MOSFET is 0V before the power MOSFET is turned on, a rise in voltage from 0V to the appropriate gate voltage $V_G$ can be caused by turning on the power MOSFET instead of being caused by an temperature condition. To detect over temperature condition during turn on, a ramp rate monitor can be used. The ramp rate at the gate G will slow down when the amount of current charging the parasitic capacitance is diverted away by any number of MOS sensors.

Figure 1C:
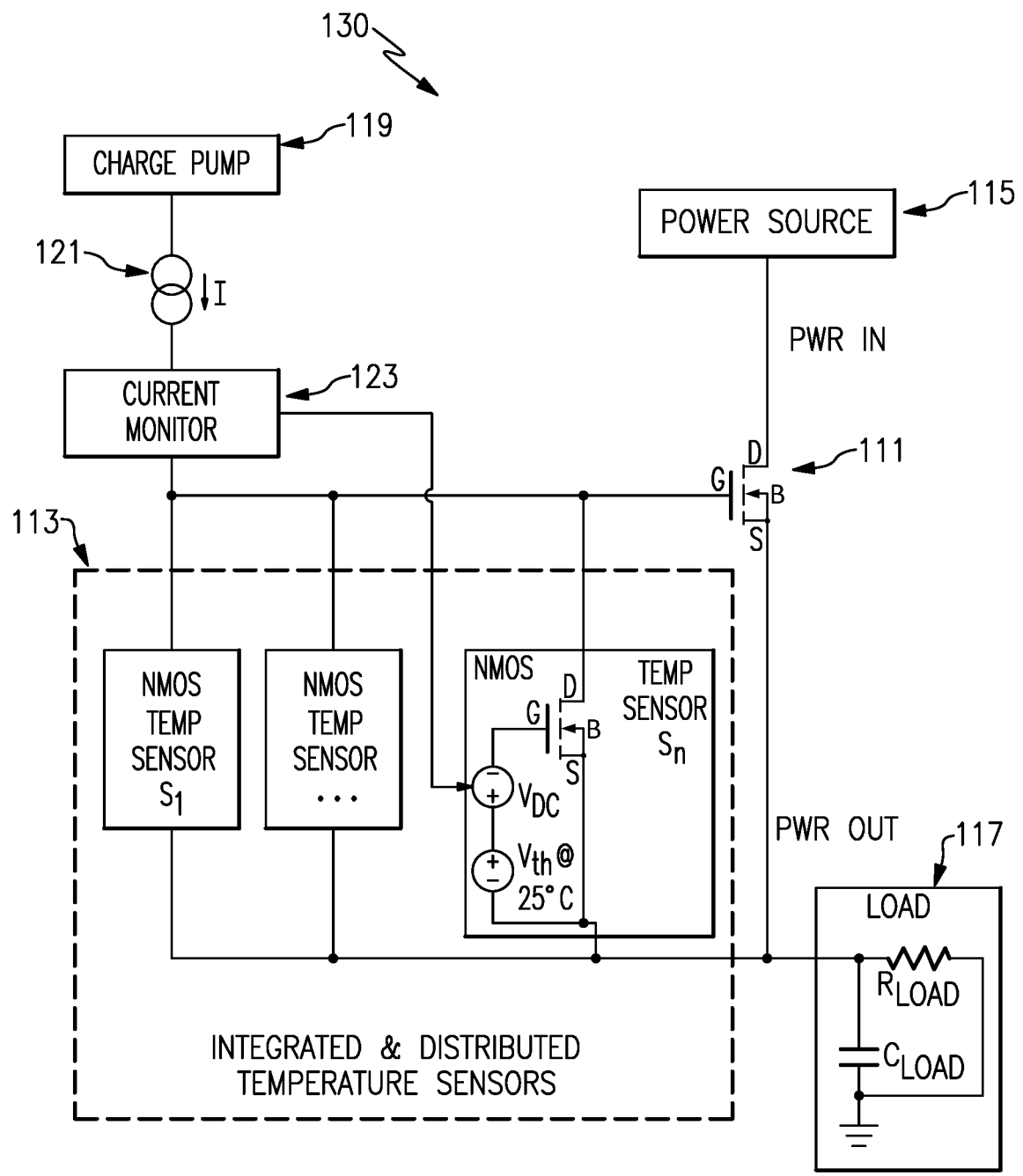
FIG. 1C shows a block diagram of an example system including an integrated and distributed nMOS sensor over temperature regulation system for a power MOSFET implementing thermal hysteresis.

FIG. 1C shows a block diagram of an example system 130 including an integrated and distributed nMOS sensor over temperature regulation system for a power MOSFET 111 implementing thermal hysteresis. FIG. 1C includes elements similar to those in FIG. 1B.

In FIG. 1C, the current monitor 123 can include control circuitry or logic to adjust $V_{DC}$ to provide hysteresis when an over temperature condition is detected by the current monitor 123. For example, when the current monitor 123 detects a current flow exceeding a threshold amperage indicative of one or more of the MOS sensors $S_1$-$S_n$ conducting in response to reaching a first trip temperature $T_{trip\_original}$, the current monitor 123 can adjust $V_{DC}$ to set $T_{trip}$ to be a second trip temperature $T_{trip\_hysteresis}$. For example, $T_{trip\_hysteresis}$ can be lower than $T_{trip\_original}$ so that if overheating is detected, the power MOSFET 111 will cool down to the lower temperature $T_{trip\_hysteresis}$ before resuming full operation again, after which $T_{trip}$ can be reverted to $T_{trip\_original}$. In some embodiments, the hysteresis effect can be additionally or alternatively used for a limited amount of time after an over temperature event.

Figure 1D:
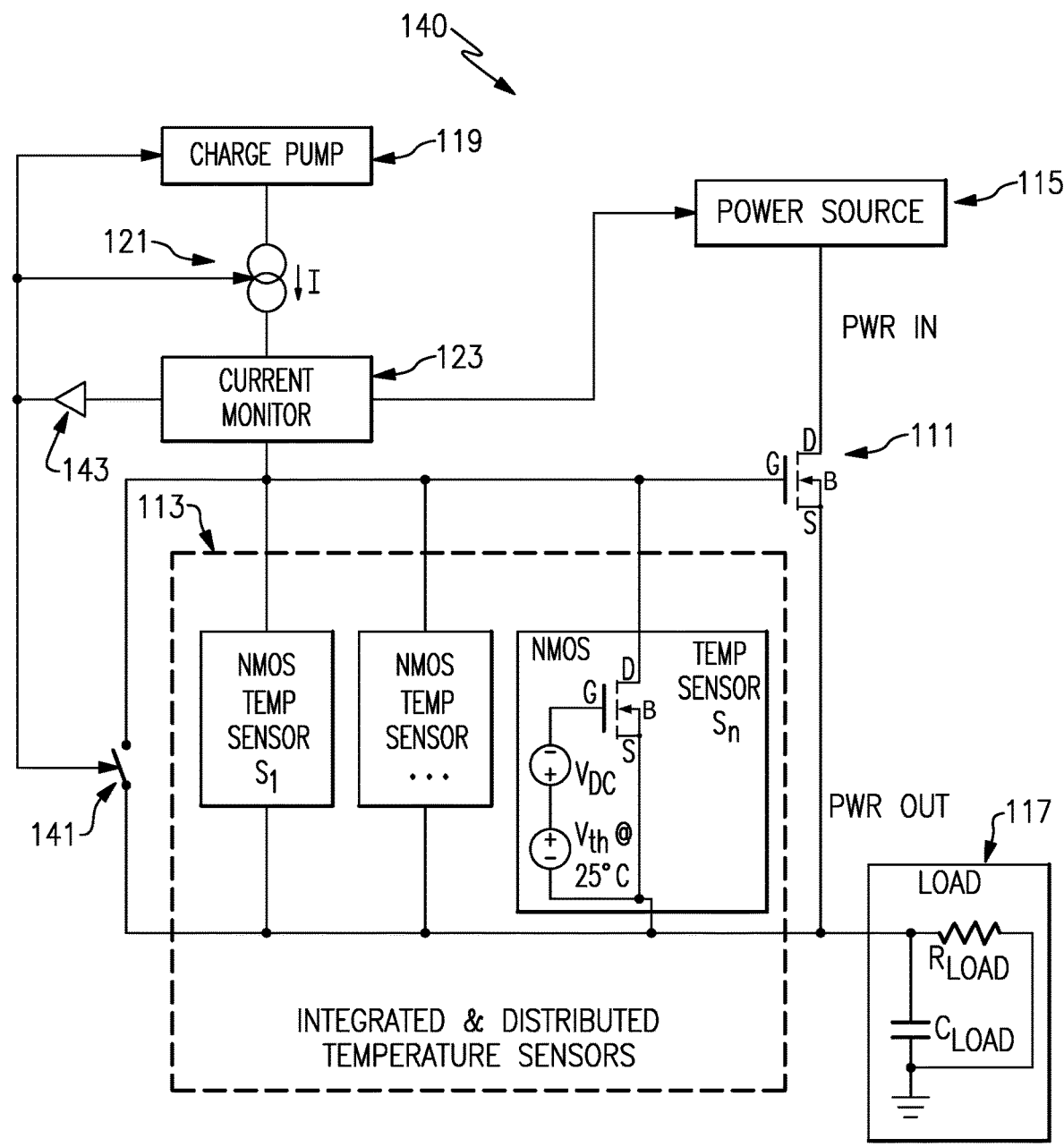
FIG. 1D shows a block diagram of an example system including an integrated and distributed nMOS sensor over temperature regulation and turn-off system for a power MOSFET.

FIG. 1D shows a block diagram of an example system including an integrated and distributed nMOS sensor over temperature regulation and turn-off system for a power MOSFET 111. FIG. 1D includes a switch 141, an amplifier 143, and elements similar to those in FIG. 1B.

In FIG. 1D, the current monitor 123 can, in response to detecting an over temperature condition, temporarily disable the operation of the power MOSFET 111. For example, the power MOSFET 111 can be disabled until it reaches a certain temperature and/or for a certain amount of time. The power MOSFET 111 can be disabled by one, some, or any combination of: disabling the charge pump 119 providing the gate voltage, disabling the current source 121 providing the gate voltage, disabling the power source 105, or closing a switch 141. The power MOSFET can additionally or alternatively be disabled by adjusting $V_{DC}$ as shown in FIG. 1C such that one or more MOS sensors $S_1$-$S_n$ are turned on.

Example nMOS Layout Diagrams

FIG. 2A shows a layout view of an example n-type power MOSFET 200 with a plurality of integrated and distributed nMOS sensors 201a-201p and corresponding expanded layout view 210. The expanded layout view 210 shows a portion of the power MOSFET 200 including: drain regions D1-D4, gates G1-G6, and source regions S1-S3. The expanded layout view 210 also shows the nMOS sensor 201h including: a p-well pw, a p+ type body ring B, an n+ type source region S, an n+ type drain region D, and a gate G. A cross section view 220 taken along line 221 is described with respect to FIG. 2B. The circles represent contacts for providing electrical pathways to the various regions. To aid clarity and to avoid overcrowding the expanded layout view 210, the tying of the body of the power MOSFET 200 to source regions S1-S3 of the power MOSFET 200 indicated in FIG. 1B, FIG. 1C, and FIG. 1D is not illustrated. However, it will be understood that the body of the power MOSFET 200 can be tied to the source regions S1-S3 of the power MOSFET within and/or outside of the expanded layout view 210.

The example power MOSFET 200 is shaped as a unit cell that can be replicated in an integrated circuit design. Other power MOSFETs can have other shapes and can be larger or smaller. In some embodiments, the power MOSFET 200 can be integrated on a semiconductor with other integrated electronic devices. In some embodiments, the power MOSFET 200 can be packaged as an individual chip. In some embodiments, the power MOSFET 200 can be packaged with or without other electronic devices, such as the charge pump, current source, and current monitor shown in FIG. 1B.

A plurality of nMOS sensors 201a-201p are distributed within the outline of the area that the power MOSFET 200 occupies on the semiconductor substrate. The outline can be a boundary of an exterior perimeter of the power MOSFET 200, and the plurality of nMOS sensors 201a-201p are within the area or layout outlined by the power MOSFET 200. Each of the nMOS sensors 201a-201p can respond to a temperature of a local region of the power MOSFET 200. In some embodiments, the nMOS sensors 201a-201p can be uniformly distributed over the power MOSFET 200. For example, with an nMOS sensors 201a-201p every 200 µm apart in both vertical and horizontal directions, the furthest point between sensors on the die is about 141 µm. Due to the closer distance, the nMOS sensors 201a-201p can respond to heating in much shorter times in comparison to single sensor designs. Larger or smaller distances can be used in various embodiments.

The nMOS sensors can be arranged in an array and include at least a 1×2, 2×2, 4×4, 5×5, or 10×10 arrangement or any other arrangement that can be larger or smaller in any dimension. The nMOS sensors can also be arranged in other patterns, such as a staggered array, distributed more densely closer to critical areas, or in any other distribution including non-uniform distributions. When the nMOS sensors 201a-201p are connected in parallel, an overheating condition near just one of the nMOS sensors 201a-201p can trigger an nMOS sensors 201a-201p to activate to shut down and/or reduce the operation of the power MOSFET 200.

The expanded view 210 shows the structure of a part of the power MOSFET 200, which includes a plurality of drain regions D1-D4, a plurality of source regions S1-S3, and a plurality of gates G1-G6. The drain regions D1-D4 are electrically coupled to each other through a metal layer (such as shown in FIG. 2B), routing layer, or other part of the power MOSFET 200. The source regions S1-S3 are electrically coupled to each other through a metal layer (such as shown in FIG. 2B), routing layer, or other part of the power MOSFET 200. The gates G1-G6 are coupled to each other through a metal layer (such as shown in FIG. 2B), routing layer, or other part of the power MOSFET 200. The arrangement of gates G1-G6, source regions S1-S3, and drain regions D1-D4 of the power MOSFET 200 in a "finger" (sometimes also referred to as a "stripe" or "segment") layout can extend through the rest of the power MOSFET 200. In various embodiments, other types of layouts can be used for the drain, source, and gate of the power MOSFET 200.

The drain regions D1-D4 receive input power to the power MOSFET 200. The source regions S1-S3 provide output power from the power MOSFET 200. A voltage and/or current can be applied to the gates G1-G6 to control the operation of the power MOSFET 200. For the n-type power MOSFET 200, a voltage and/or current can be applied to the gates G1-G6 to operate the power MOSFET 200, lowered to reduce the operation of the power MOSFET 200, and further lowered to disable operation of the power MOSFET 200.

The nMOS sensors 201a-201p are configured to turn on and divert current away from the gates G1-G6 of the power MOSFET 200 in response to local overheating such that the voltage at the gates G1-G6 drop and the operation of the power MOSFET 200 is reduced and/or disabled. The expanded view 210 shows that the nMOS sensor 201h includes a source region S, a gate G, and a drain region D. As shown in FIG. 1B and FIG. 2B, the source region S of the nMOS sensor 201h is coupled to the body ring B of the nMOS sensor 201h and also coupled to the source regions S1-S3 of the power MOSFET 200. The drain region D of the nMOS sensor 201h is coupled to the gates G1-G6 of the power MOSFET 200.

In various embodiments, other types of layouts can be used for the nMOS sensors. Although the example nMOS sensor 201h is positioned as interrupting source finger S2 and parts of two drain fingers D2 and D3 of the power MOSFET 200, in other embodiments, the nMOS sensors can be in locations that wholly or partially interrupt any number and/or combination of source or drain regions of the power MOSFET 200. In some embodiments, contacts to a partially interrupted region (such as drain region D2) may be shifted, changed, or omitted to accommodate the nMOS sensor 201h.

FIG. 2B shows a cross section view 220 of the example power MOSFET 200 of FIG. 2A along line 221. The cross section view 220 shows parts of the power MOSFET 200 including n+ type drain regions D1-D4, n+ type source regions S1 and S3, and gates G1, G2, G5, and G6 with respective insulators underneath. The source regions S1, S3 are formed in a high voltage p-well "hvpw" that separates the source regions S1, S3 from the N-type tub "N-TUB" and from the n+ drain regions of the power MOSFET.

The cross section view 200 also shows parts of the nMOS sensor 201h including the n+ type source region S, n+ type drain region D, the p+ body ring B, and the body p-well pw. The nMOS sensor 201h is formed within the N-TUB. The N-TUB couples the drain regions D1-D4 together. The N-TUB, including the power MOSFET 200 and the nMOS sensors 201a-201p, is formed on a common p-type semiconductor substrate "P-SUB." Within the N-TUB, the drains D1-D4 are not laterally isolated from each other. The N-TUB is not vertically isolated from the P-SUB. The power MOSFET 200 is also not laterally isolated from the nMOS sensor 201h by insulators near the surface. The reduced isolation illustrated in FIG. 2B allows for simpler, less expensive fabrication in exchange for increased risks of device-to-device interaction. In other embodiments, the drains D1-D4 and/or N-TUB can be vertically isolated from the P-SUB, the drains D1-D4 can be laterally isolated from each other, and/or the power MOSFET 200 can be laterally isolated from the nMOS sensor 201h.

One or more layers of metal or other routing provide electrical pathways between the various regions. As described with respect to FIG. 2A, the gates G1, G2, G5, and G6 of the power MOSFET 200 are electrically coupled to each other, the source regions S1 and S3 of the power MOSFET 200 are electrically coupled to each other, and the drain regions D1-D4 of the power MOSFET 200 are electrically coupled to each other. The electrical connections between the power MOSFET 200 and the nMOS sensor 201h, such as described with respect to FIGS. 1B-1D, are also illustrated.

Example pMOS Systems

Figure 3A:
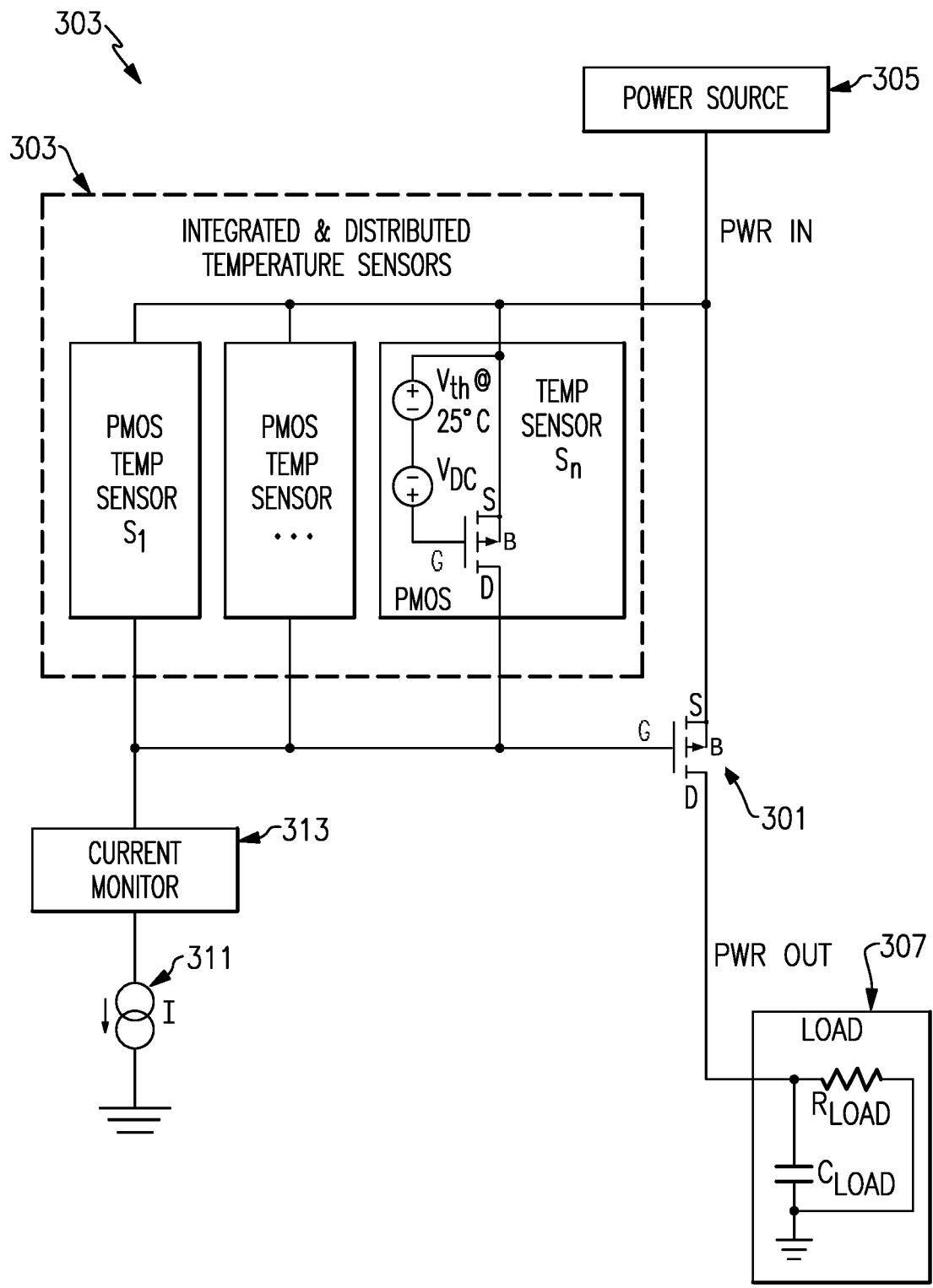
FIG. 3A shows a block diagram of an example system including an integrated and distributed pMOS sensor over temperature regulation system for a p-type power MOSFET.
Figure 3B:
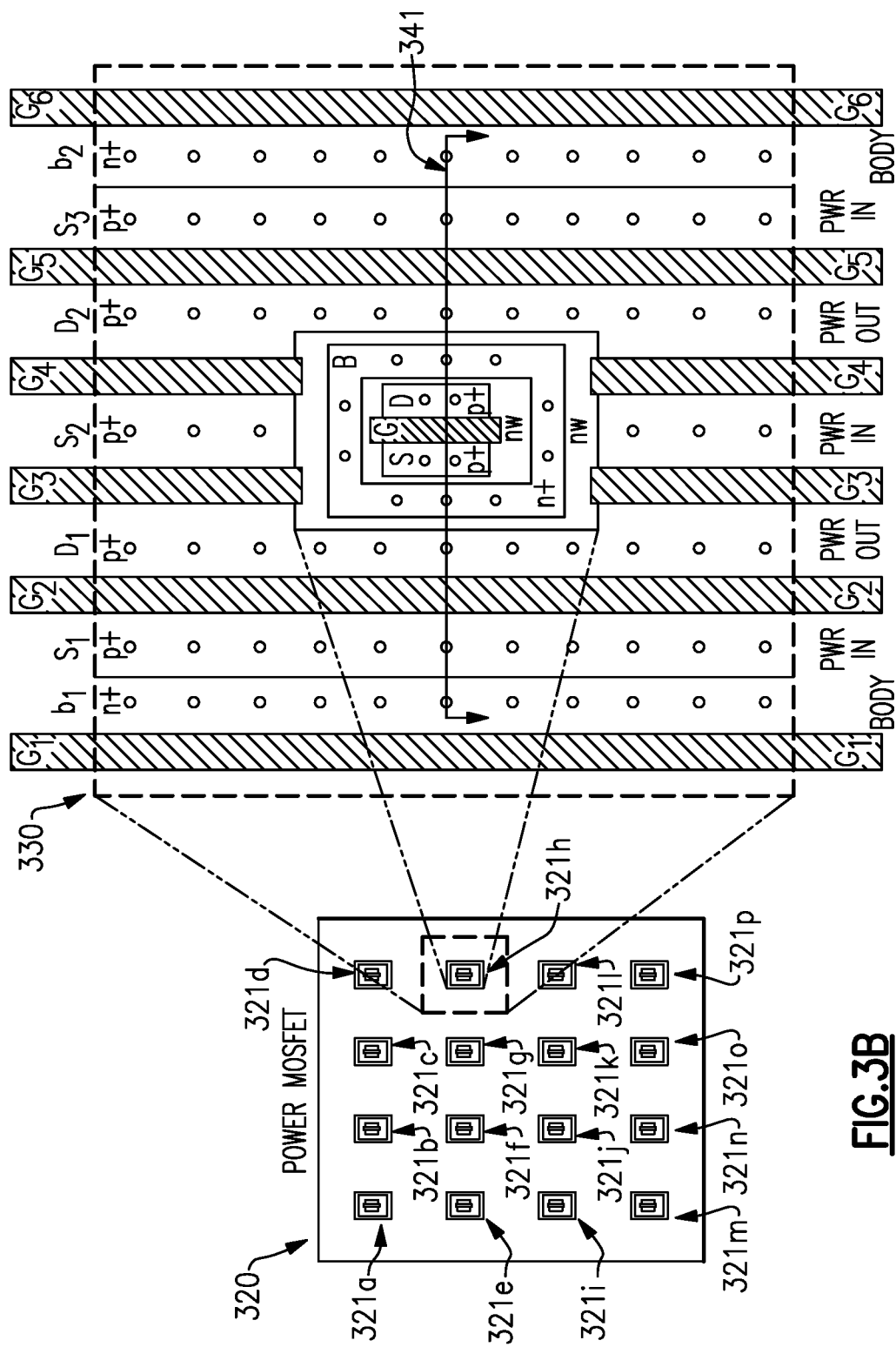
FIG. 3B shows a layout view of an example p-type power MOSFET with a plurality of integrated and distributed pMOS sensors and corresponding expanded layout view.

FIG. 3A shows a block diagram of an example system 300 including an integrated and distributed pMOS sensor over temperature regulation system 303 for a p-type power MOSFET 301. The system 300 includes the power MOSFET 301, the integrated and distributed pMOS sensor over temperature regulation system 303 including a plurality of temperature sensors $S_1$ through $S_n$, a power source 305, a load 307, a current source 311, a current monitor 313, and a gate to source voltage ($V_{GS}$) bias network including voltage sources $V_{DC}$ and $V_{th@25° C.}$. The system 300 of FIG. 3A is a pMOS implementation of the system 110 of FIG. 1B and operates similarly.

The pMOS implementation of FIG. 3A offers some trade-offs in comparison to the nMOS implementation. The on-state resistance of a pMOS transistor can be higher, in some cases approximately two to three times higher, than the on-state resistance of an nMOS transistor of similar size. Accordingly, the pMOS sensors S1-Sn and power MOSFET 301 may be less efficient and/or occupy a larger area than corresponding nMOS versions.

The pMOS implementation allows for easier driving of the p-type power MOSFET 301 gate, which can be driven between its power supply rails. In contrast, to provide a positive $V_{GS}$ to the n-type power MOSFET 111 of FIG. 1B, the gate of the n-type power MOSFET 111 is driven above a voltage provided by the power source 115, and the system 110 may use a voltage source and/or charge pump to do so. The pMOS implementation in the system 300 can operate without a separate charge pump or voltage source. The pMOS implementation can be used with simpler driver designs. The pMOS implementations can be used in some applications using certain power ranges and/or applications where efficiency is less impactful.

FIG. 3B shows a layout view of an example power p-type MOSFET 320 with a plurality of integrated and distributed pMOS sensors 321a-321p and corresponding expanded layout view 330. The expanded layout view 330 shows a portion of the power MOSFET 320 including: drain regions D1 and D2, gates G1-G6, source regions S1-S3, and body regions b1 and b2. The expanded layout view 340 also shows the pMOS sensor 321h including: a n-well nw, a n+ type body ring B, a p+ type source region S, a p+ type drain region D, and a gate G. A cross section view 350 taken along line 341 is described with respect to FIG. 3C. The circles represent contacts for providing electrical pathways to the various regions.

The power p-type MOSFET 320 operates similarly to the n-type MOSFET 200 described with respect to FIG. 2A with power sources reversed and the typing of the regions flipped. Power is received through the source regions S1-S3 of the power MOSFET 320. The pMOS sensor 321h has a p-type source region S and a p-type drain region D that are formed in the n-well nw.

Figure 3C:
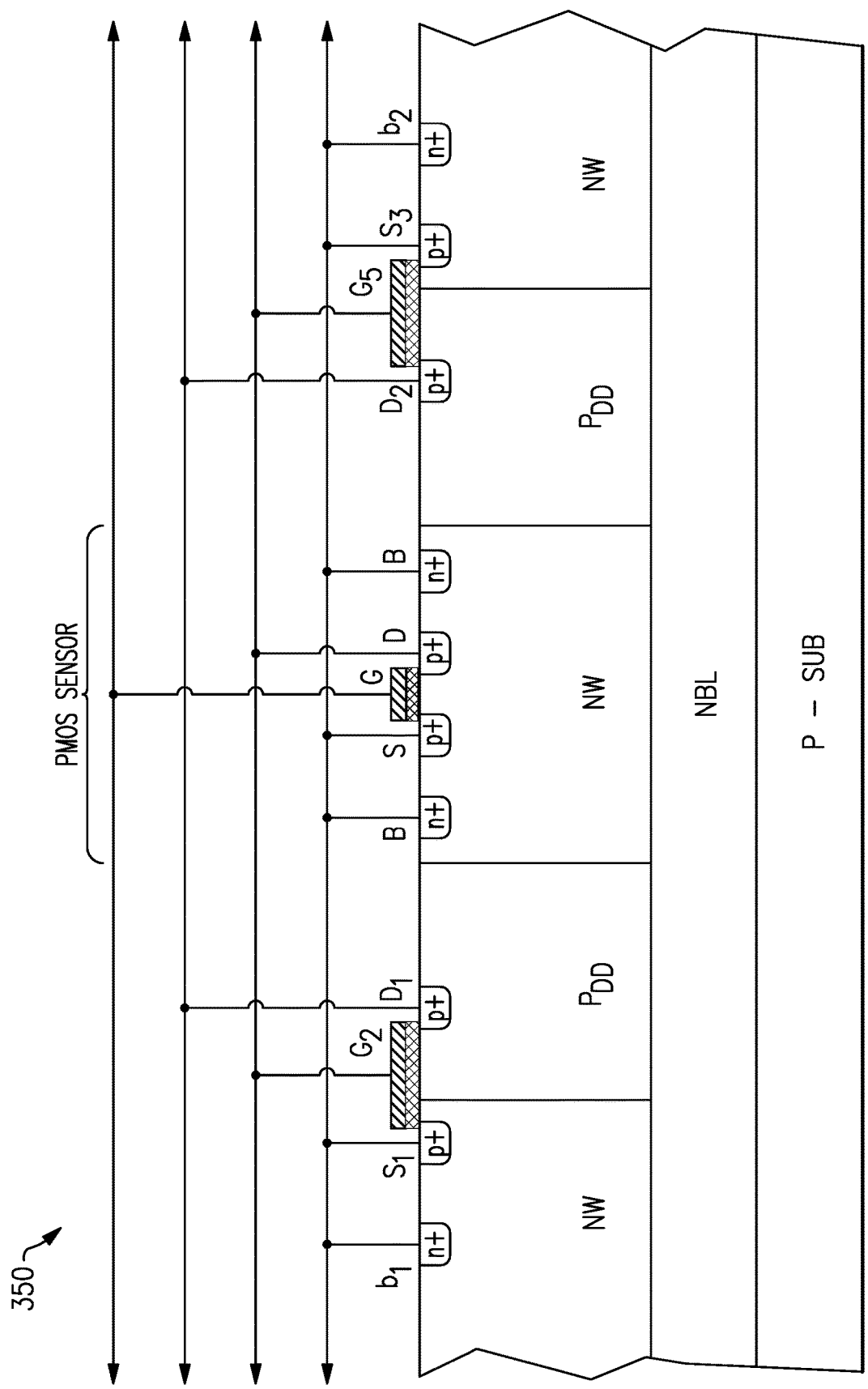
FIG. 3C shows a cross section view of the example p-type power MOSFET of FIG. 3B.

FIG. 3C shows a cross section view 350 of the example power MOSFET of FIG. 3B along line 341. The cross section view 350 shows parts of the power MOSFET 320 including: p+ type drain regions D1 and D2 in a P-type deep drain $P_{DD}$, p+ type source regions S1 and S3 formed in an n-type well NW, gates G2 and G5 with respective insulators underneath, and high conductivity n+ type body wells b1 and b2 in the n-type well "NW." The power MOSFET 230 and the pMOS sensor 321h are formed on an N-type buried layer "NBL." The NBL is formed on a p-type substrate "P-SUB."

The NBL region isolates the drain regions D1 and D2 from the substrate P-SUB. The isolation of the drain regions D1, D2 from the substrate P-SUB can reduce disturbances and noise caused by other circuitry coupled to and/or integrated on the substrate P-SUB. The isolation between the drain regions D1 and D2 from the substrate can also reduce undesirable interactions between circuits sharing the same substrate, such as in system on a chip applications. Substrate noise can be present when a substrate to a n-type diffusion junction is forward biased or when a large displacement current is dumped into the substrate as a result of an n-type diffusion region being quickly charged or discharged. Isolation between the drain regions D1, D2 and the substrate can also reduce the impact of voltage swings at the drain regions D1, D2 on other circuits coupled to and/or integrated on the substrate P-SUB.

One or more layers of metal or other routing provide electrical pathways between the various regions. As described with respect to FIG. 3A, the gates G2 and G5 of the power MOSFET 320 are electrically coupled to each other, the source regions S1 and S3 of the power MOSFET 320 are electrically coupled to each other and to the body regions b1 and b2, and the drain regions D1 and D2 of the power MOSFET 320 are electrically coupled to each other. The electrical connections to the pMOS sensor, such as described with respect to FIG. 3A, are also illustrated.

Example Graphs

Figure 4:
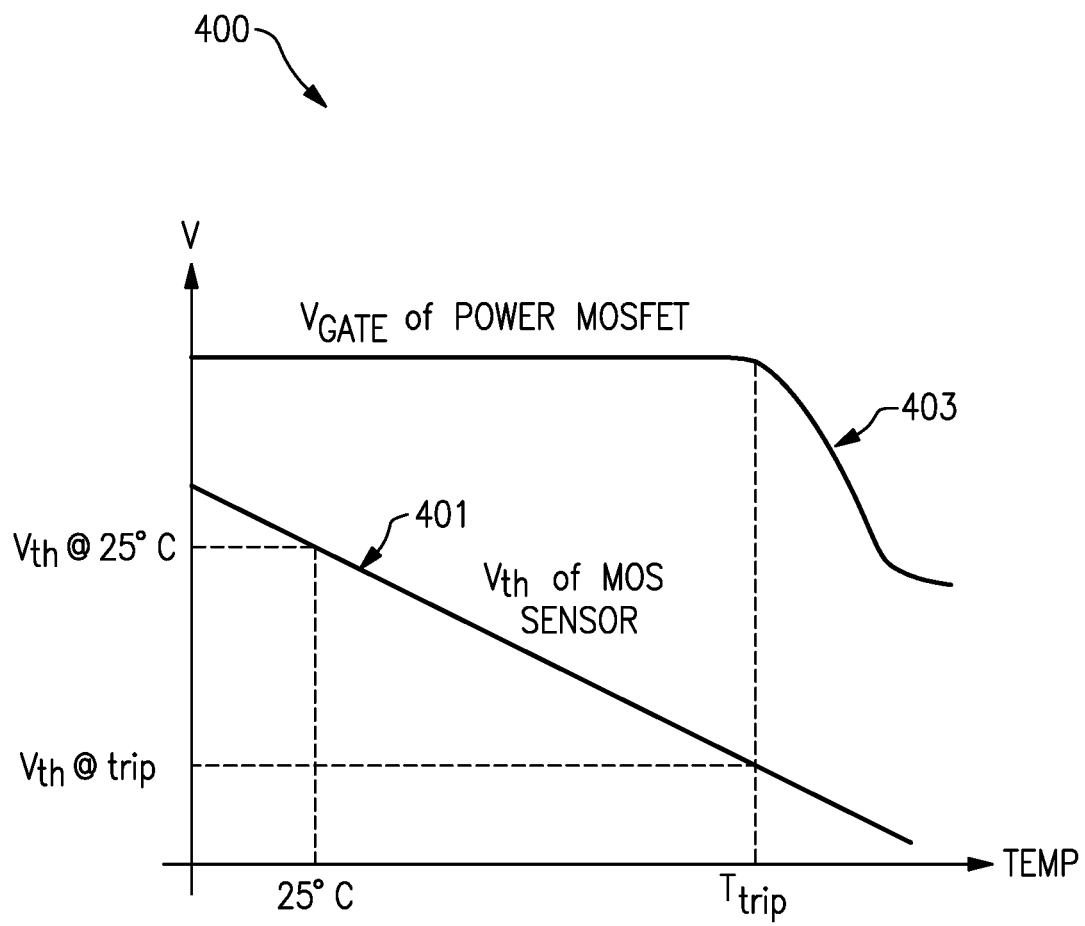
FIG. 4 shows a graph of example relationships between voltages and temperature.

FIG. 4 shows a graph 400 of example relationships between voltages and temperature. The x-axis indicates temperatures and the y-axis indicates voltages. A first curve 401 indicates the threshold voltage of a MOS sensor. A second curve 403 indicates the gate voltage of a power MOSFET.

The threshold voltage 401 is the gate to source voltage ($V_{GS}$) at which a channel starts to form in the MOS temperature sensor. The threshold voltage is approximated as an inverse linear curve 401 with respect to temperature. The slope of the curve ranges from about −1.5 mV/° C. to about −2.0 mV/° C. and may vary depending on the type of fabrication and/or composition of materials used.

At 25° C., the threshold voltage for the MOS sensor is referred to as $V_{th@25°\,C.}$. A trip temperature $T_{trip}$ can be selected as a safe operating temperature at which the MOS sensors will begin to reduce the operation of the power MOSFET. The trip temperature $T_{trip}$ corresponds to a trip threshold voltage $V_{th@trip}$.

The MOS sensors described herein can normally be biased such that they are off and do not conduct. The MOS sensors are also biased to trip at the selected temperature $T_{trip}$. When a MOS sensor trips in response to a high temperature causing the threshold voltage $V_{th}$ to fall below its DC gate voltage, the MOS sensor begins to form a conductive channel that directs current away from the gate of the power MOSFET.

In response, the voltage 403 at the gate of the power MOSFET begins to decrease, which causes the operation of the power MOSFET to decrease and eventually turn off. Accordingly, when a local part of the power MOSFET overheats, the MOS sensor will reduce and/or disable the operation of the power MOSFET at least until the temperature falls below the trip temperature $T_{trip}$, and until the temperature falls further if a hysteresis or timer is implemented.

In some embodiments, a system can include a reference circuit to generate $V_{th@25°\,C.}$ and a second voltage for setting the trip voltage with respect to $V_{th@25°\,C.}$. For example, FIG. 1B includes both $V_{th@25°\,C.}$ and $V_{DC}$. In such a system, $V_{th@25°\,C.}$ can be a constant or fixed voltage while $V_{DC}$ can be adjusted to change the trip temperature $T_{trip}$ at which the MOS sensor will turn on. In some embodiments, a single set or variable voltage source can be used in place of the two voltage source shown in FIG. 1B. FIG. 8 shows an example circuit for generating $V_{th@25°\,C.}$ for a MOS sensor.

Figure 5A:
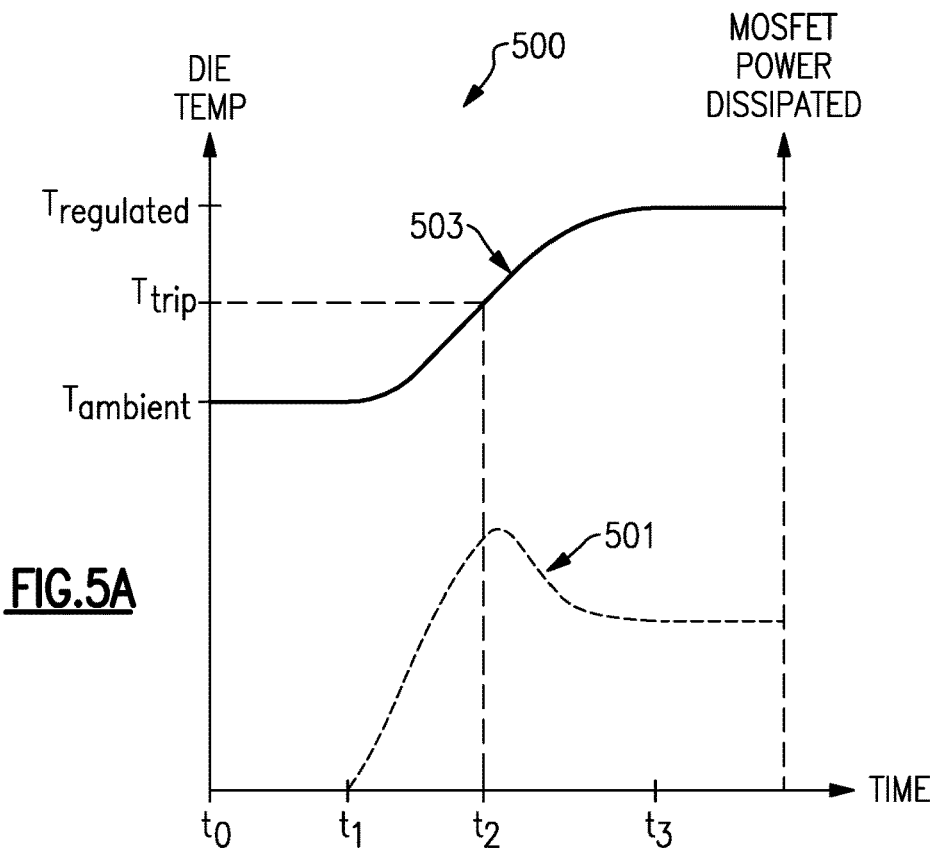
FIG. 5A shows a graph of power dissipation and die temperature for an example die having a power MOSFET with an integrated and distributed over temperature regulation system implementing an approximately linear control response.

FIG. 5A shows a graph 500 of power dissipation 501 and die temperature 503 for an example die having a power MOSFET with an integrated and distributed over temperature regulation system implementing an approximately linear control response. The system is configured to provide, at least initially, an approximately linear response to overheating by proportionally reducing operation of the power MOSFET in response to rises in temperature beyond a trip temperature.

At time $t_0$, the power MOSFET is off and the die temperature is at an ambient temperature $T_{ambient}$.

At time $t_1$, the power MOSFET turns on and begins to quickly deliver power to a load. As the power 501 is dissipated, the die temperature 503 begins to rise from $T_{ambient}$. For example, if the power MOSFET has a drain at 12V and a source at 0V and dissipates 60 W for a drain current of 5 A to the load, the power MOSFET can experience a steep rise in temperature.

At time $t_2$, one or more MOS sensors reaches the trip temperature $T_{trip}$ and begin to form a conductive channel. The power dissipated 501 may temporarily overshoot as one or more MOS sensors activate to control the gate of the power MOSFET to maintain the die temperature 503 with a reduced power dissipation rate.

At time $t_3$, one or more MOS sensors has formed a conductive channel sufficient to pull down the gate voltage of the power MOSFET such that the operation of the power MOSFET is reduced and dissipates less power. In response, the temperature 503 of the die reaches the regulated temperature $T_{regulated}$ and operates at the regulated temperature $T_{regulated}$ without further heating. If the die were to further overheat, then the MOS sensors could further reduce or even disable the operation of the power MOSFET.

Figure 5B:
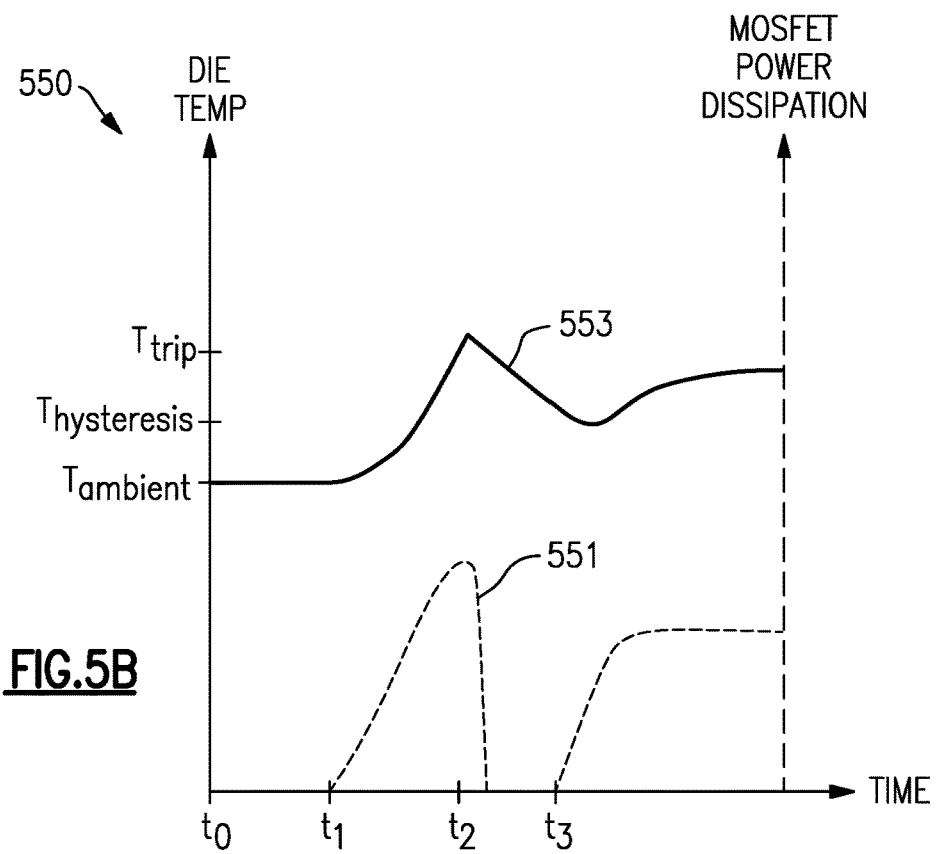
FIG. 5B shows a graph of power dissipation and die temperature for an example die having a power MOSFET with an integrated and distributed over temperature regulation system implementing a turn-off and hysteresis control response.

FIG. 5B shows a graph 550 of power dissipation 551 and die temperature 553 for an example die having a power MOSFET with an integrated and distributed over temperature regulation system implementing a turn-off and hysteresis control response. The temperature regulation system is configured to turn off the power MOSFET when one or more sensors reach the trip temperature $T_{trip}$ and provide a hysteresis response by resuming operation once the temperature has reached a lower temperature $T_{hysteresis}$. In some designs, $T_{hysteresis}$ can additionally or alternatively have a timer based component.

At time $t_0$, the power MOSFET is off and the die temperature is at an ambient temperature $T_{ambient}$.

At time $t_1$, the power MOSFET turns on and begins to quickly deliver power to a capacitive load. As the power 551 is dissipated, the die temperature 553 begins to rise from $T_{ambient}$. For example, if the power MOSFET has a drain at 12V and a source at 0V and dissipates 60 W for a drain current of 5 A to the load, the power MOSFET can experience a steep rise in temperature.

At time $t_2$, one or more MOS sensors reaches the trip temperature $T_{trip}$ and begin to form a conductive channel. The power dissipated 501 may temporarily overshoot as one or more MOS sensors activate to control the gate of the power MOSFET to disable the power MOSFET until it cools down. In response to reaching the trip temperature $T_{trip}$, the system disables the power MOSFET, and the temperature 553 of the die begins to cool.

At time $t_3$, the temperature 553 of the die has sufficiently cooled and reaches the lower temperature $T_{hysteresis}$. In response, the power MOSFET is enabled again and begins to dissipate increasing amounts of power 551. If the capacitive load is substantially or fully charged, then the capacitive load may draw a stabilized amount of power that does not cause the temperature 553 to rise to the trip temperature $T_{trip}$, and the power MOSFET will continue to operate with the stabilized power dissipation.

Example System Applications

Figure 6A:
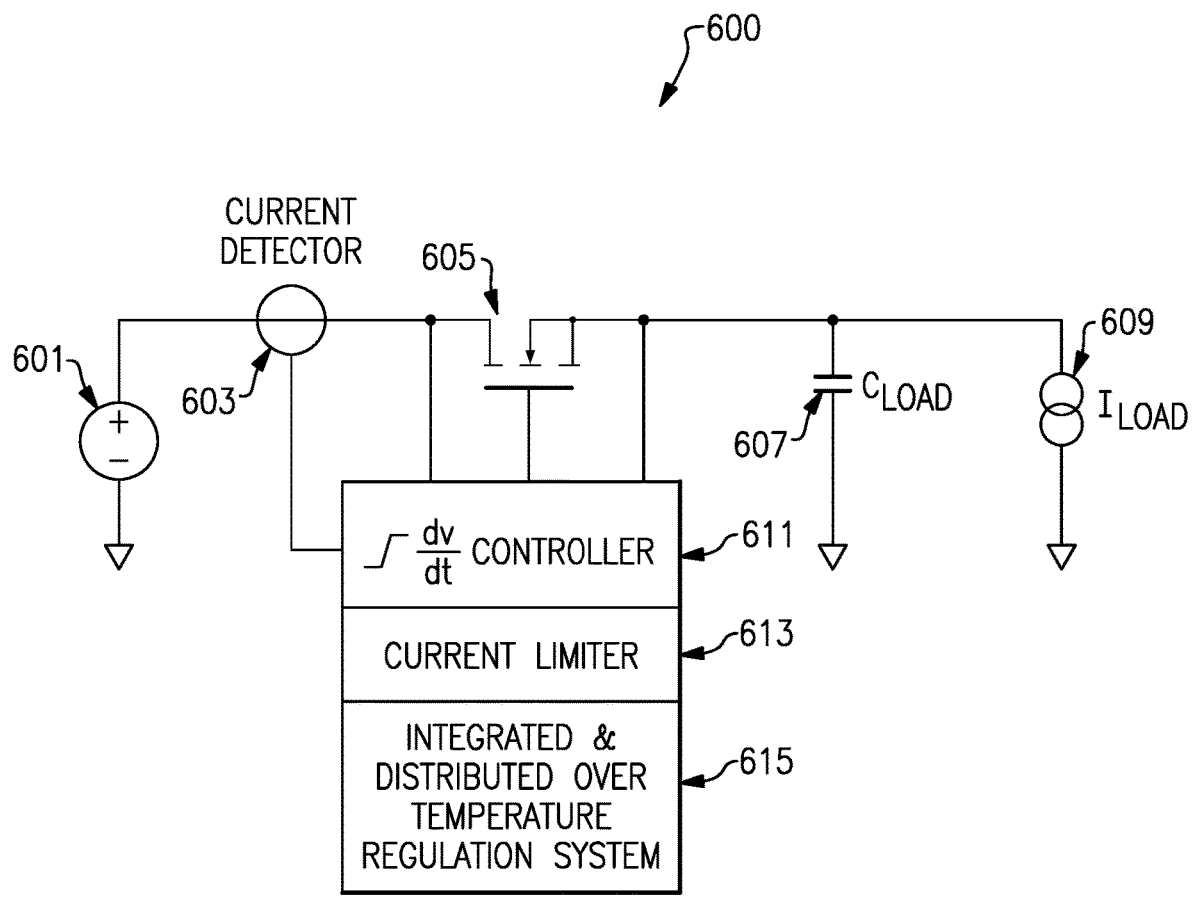
FIG. 6A shows a block diagram of an example power delivery system.

FIG. 6A shows a block diagram of an example power delivery system 600. The block diagram includes a voltage source 601, a current detector 603, a power MOSFET 605, a capacitive load element 607, a load current source 609, a voltage rate change controller 611, a current limiter 613, and an integrated and distributed over temperature regulation system 615.

The power MOSFET 605 can be similar to the n-type power MOSFET of FIG. 1B. The power MOSFET 605 is configured to regulate the delivery of power from the voltage source 601 to the load, which can include a capacitive load element 607 and a load current source 609. In other embodiments, the power MOSFET 605 can be a p-type MOSFET such as shown in FIG. 3A or any power switch from FIG. 1A.

The voltage rate change controller 611 is configured to control the gate voltage of the power MOSFET 605. The voltage rate change controller 611 is also configured to limit a rate at which the gate voltage changes be within a threshold voltage ramp rate. The voltage rate change controller 611 can protect against high inrush currents.

The current limiter 613 is configured to limit a current delivered to the gate of the power MOSFET 605 to a threshold current. The current limiter 613 can protect against high inrush currents.

The integrated and distributed over temperature regulation system 615 is configured to protect the power MOSFET 605 from localized overheating. Examples of integrated and distributed over temperature regulation system 615 are described with respect to FIGS. 1A-3C.

The current detector 603 can monitor a quantity of current being provided through the power MOSFET 605 to the load elements.

Figure 6B:
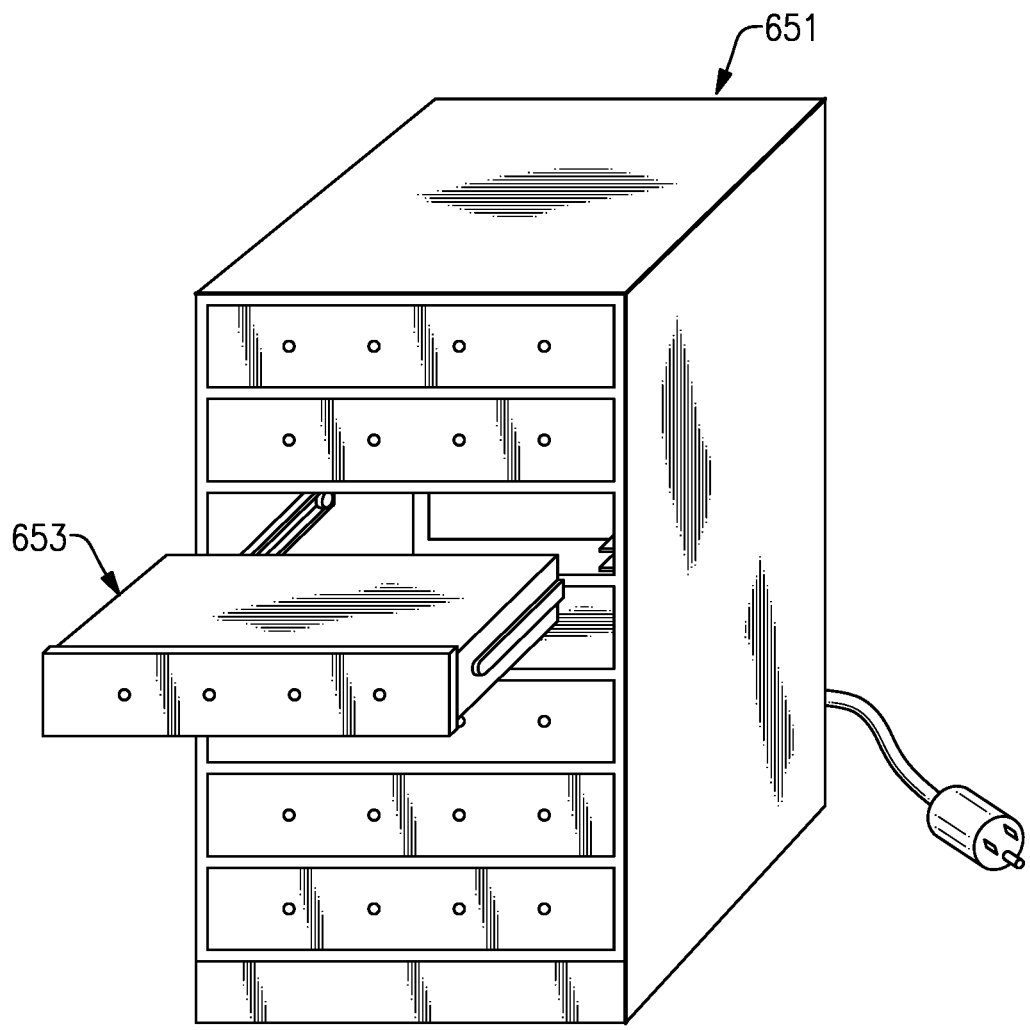
FIG. 6B shows an example server using a power delivery system.

FIG. 6B shows an example server 651 using a power delivery system, such as the power delivery system 600 described with respect to FIG. 6A. The server 651 includes a plurality of hot-swappable computer blades 653.

As a computer blade 653 is inserted and powered on, the computer blade 653 initially draws a large amount of power to power up. A power switch, such as a power MOSFET, can regulate the delivery of power from the server chassis to the computer blade 653. The initial inrush can cause the power MOSFET to experience localized overheating. To protect against the localized overheating, the power MOSFET can include an integrated and distributed over temperature regulation system such as described with respect to FIGS. 1A-3C.

Power switches can be used to deliver power in various applications. For example, an inrush of power may be experienced when an electrical system is first powered on, when hot-swappable components are inserted, when daughterboard components are coupled, when a circuit breaker is closed, and the like. Such inrushes of power may cause the power switches to overheat.

Other Example Designs

Figure 7A:
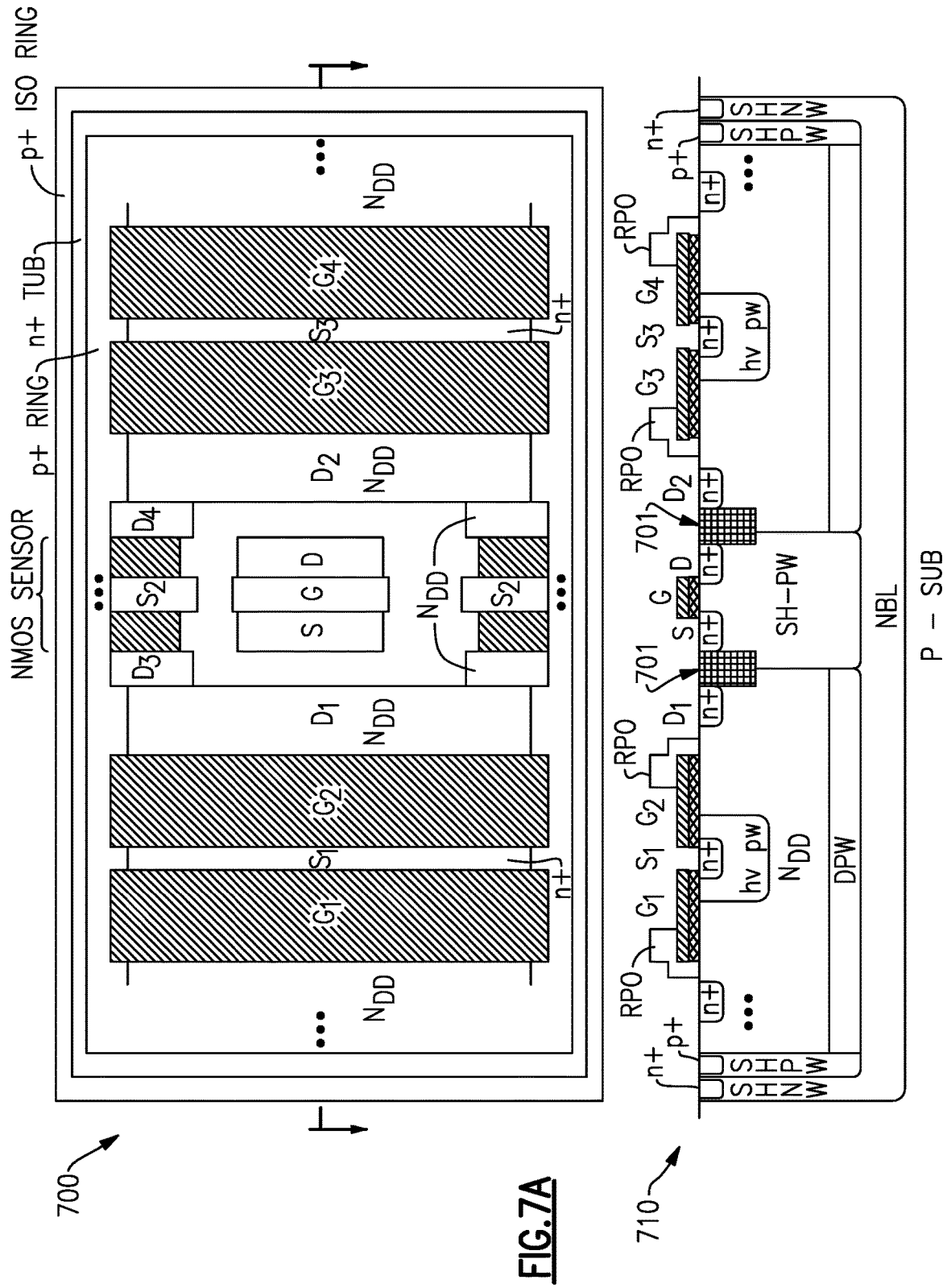
FIG. 7A shows a layout view and corresponding cross-section view of a portion of an example power MOSFET having an integrated and distributed nMOS sensor over temperature regulation system.

FIG. 7A shows a layout view 700 and corresponding cross-section view 710 of a portion of an example power MOSFET having an integrated and distributed nMOS sensor over temperature regulation system. The portion includes one nMOS sensor including an n+ source region S, gate G, and n+ drain region D in a shallow p-type well "SH-PW" surrounded by an insulator. The portion also includes parts of the power MOSFET including: gates G1-G4, n+ source regions S1-S3, and n+ drain regions D1-D4. It will be understood that the power MOSFET can further extend in all directions and include additional nMOS sensors within the surrounding p+ RING shown in the layout view 700. The system of FIG. 7A is similar to the expanded layout view 210 of FIG. 2A.

In FIG. 7A, the nMOS sensor is isolated by an inter-active insulator 701, such as an oxide shallow trench isolation (STI), from the power MOSFET. In some embodiments, the source S and drain D of the nMOS sensor can be adjacent to or directly abutted to the insulator 701. The insulator 701 of FIG. 7A can be used as an alternative or in combination with the pw/p+/pw nMOS ring layout in FIG. 2B. Resist protect oxide "RPO" can be placed between the gates and drains of the power MOSFET to reduce silicide diffusion.

The cross section view 710 shows n+ doped active drain regions D1 and D2 of the power MOSFET, which can be formed inside an n-type deep drain "$N_{DD}$" regions over deep p-wells "DPW." The shallow p-well SH-PW of the nMOS sensor and the n-type deep drain $N_{DD}$ regions are isolated from the p-type substrate "P-SUB" by an n-type buried layer "NBL." The power MOSFET can be surrounded by the n-type buried layer NBL and a shallow n-well "SHNW," which is shown as an n+ ring in the layout view. A shallow p-well "SHPW" can separate the power MOSFET from the shallow n-well SHNW. A p+ doped isolation ring "p+ ISO RING" can further isolate the power MOSFET from other devices on the substrate P-SUB.

Figure 7B:
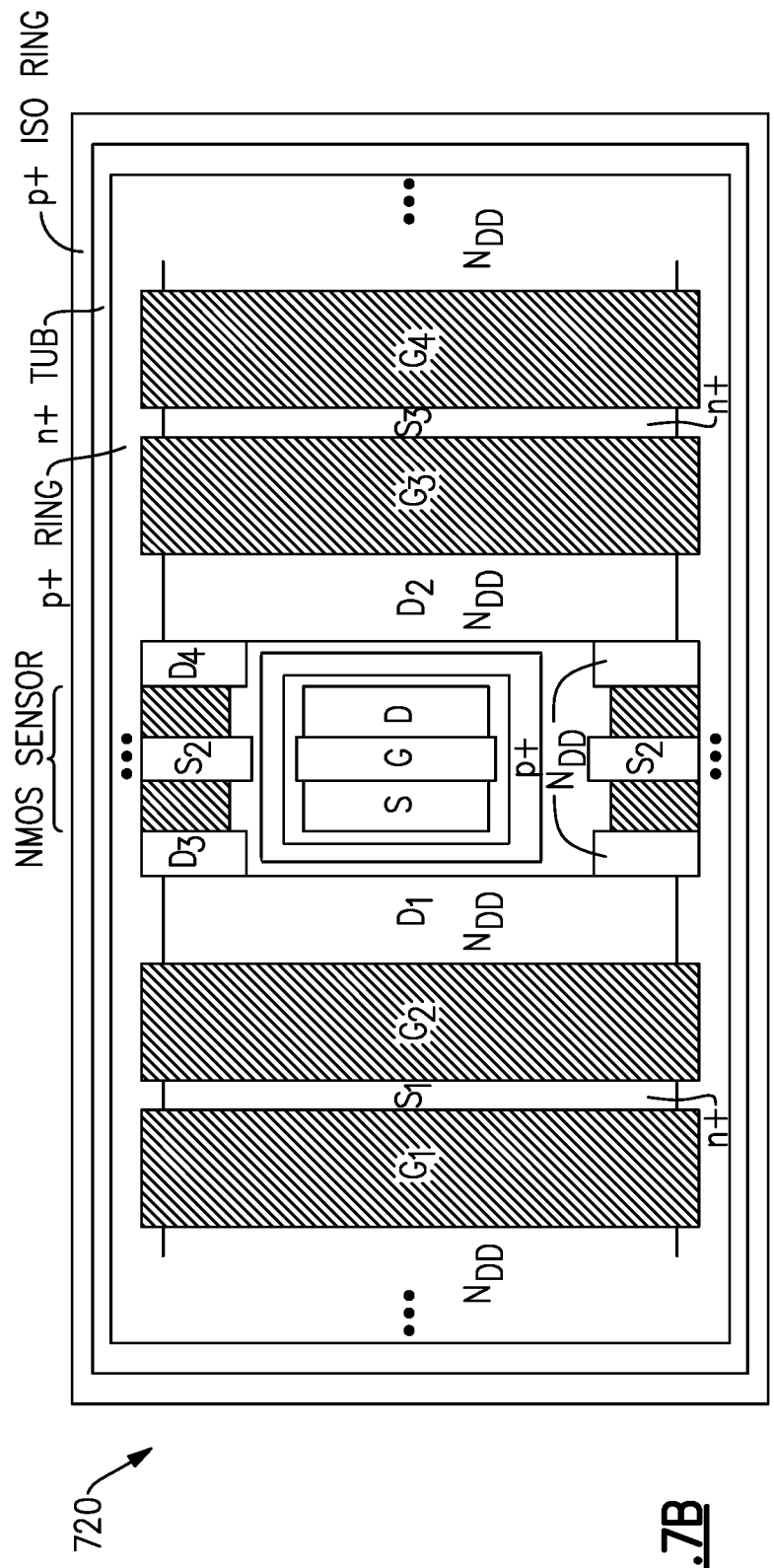
FIG. 7B shows a layout view of a portion of an example MOSFET having an integrated and distributed nMOS sensor over temperature regulation system with an embedded body connection control ring.

FIG. 7B shows a layout view of a portion of an example MOSFET having an integrated and distributed nMOS sensor over temperature regulation system. The layout of FIG. 7B is similar to the layout shown in FIG. 7A, except that a p+ ring region surrounds and encloses the nMOS sensor. The p+ ring region is further illustrated in the cross section view of FIG. 7C.

Figures 7C, 7D:
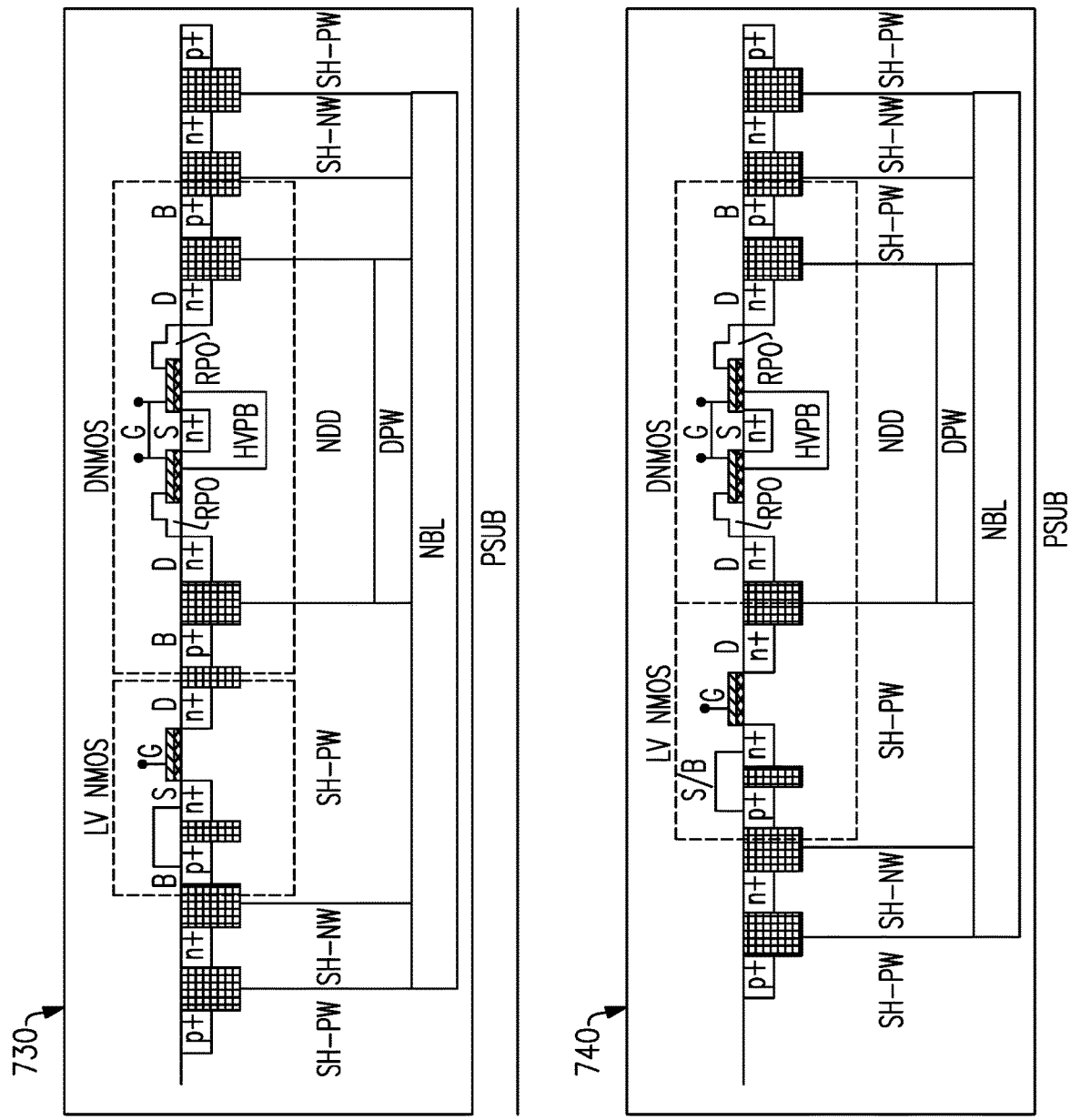
FIG. 7C shows a cross-section view of an example power MOSFET having an integrated and distributed nMOS sensor over temperature regulation system.
FIG. 7D shows a cross-section view of an example power MOSFET having an integrated and distributed nMOS sensor over temperature regulation system.

FIG. 7C shows a cross-section view 730 of an example power MOSFET having an integrated and distributed nMOS sensor over temperature regulation system. The power MOSFET is a diffused n-type MOSFET (DNMOS) and the sensor is a low voltage n-type MOSFET (LV NMOS). The layout can extend such that the DNMOS and/or LV NMOS extends and/or repeats. The DNMOS can be a higher voltage device, such as a 16V DNMOS, while the LV NMOS can be a lower voltage device, such as a 5V LV NMOS. Other voltage differences can be used.

In the example cross section view 730, the LV NMOS is in a shallow p-type well SH-PW with body regions B on both sides. The body regions B and insulating regions can form rings that separate the LV NMOS from the DNMOS at shallower depths. The drains D of the DNMOS are formed in an n-type deep drain $N_{DD}$ region over a deep p-type well DPW. Both the LV NMOS and the DNMOS are insulated from the p-type substrate PSUB by an n-type buried layer NBL.

FIG. 7D shows a cross-section view 740 of an example power MOSFET having an integrated and distributed nMOS sensor over temperature regulation system. Elements of FIG. 7D are similar to elements of FIG. 7C.

In the example cross section view 740, the LV NMOS lacks a p+ doped body B region between the drain D of the LV NMOS and the drain D of the DNMOS that is present in the cross section view 730 of FIG. 7C. In FIG. 7D, An insulator separates the LVNMOS and the DNMOS at shallower depths. By omitting the p+ doped body B region between the drain D of the LV NMOS and the drain D of the DNMOS, the layout can be made smaller in exchange for increased risk of device to device interaction.

Additional Circuits

FIG. 8 shows an example circuit 800 for generating a reference voltage. The reference voltage can be a threshold voltage, such as $V_{th@25°\ C.}$ or any other temperature. The system includes an input IN, an output OUT, an n-type MOSFET N1, a bipolar NPN transistor Q1, a variable current source IPTAT that is configured to vary proportionally to temperature, a variable current source ICTAT that varies complement to temperature, resistor R1, and resistor R2. The transistor N1 can be selected to be the same type as the MOS sensor. The output voltage at node TGATE can be made approximately equal to MOSFET N1's threshold voltage over a wide operating temperature by adjusting the values of the currents for IPTAT, ICTAT and resistances for R1 and R2, such as by using simulators. For particular values for IPTAT, ICTAT, R1, and R2, the voltage at TGATE can be set to $V_{th@25°\ C.}$.

Figure 9:
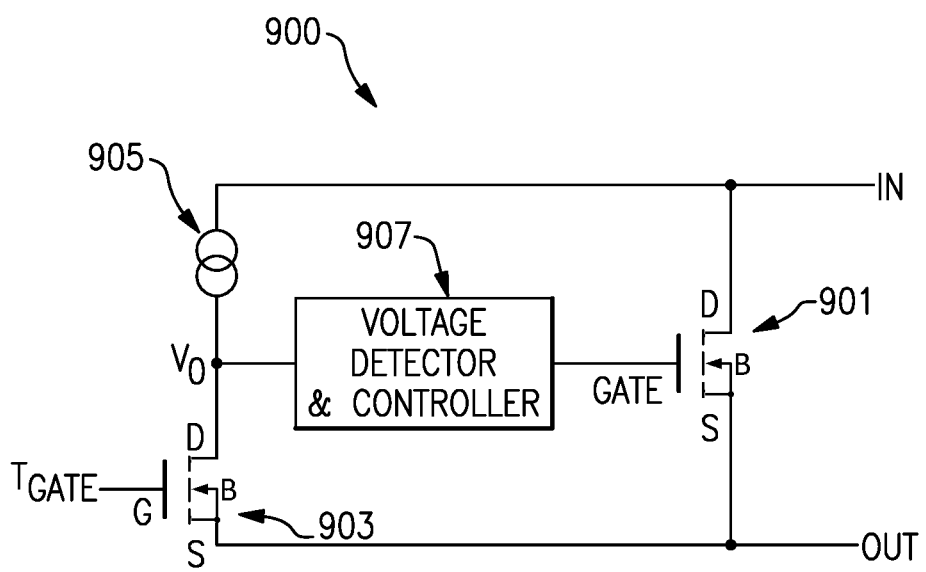
FIG. 9 shows an example schematic of an example n-type power MOSFET having an integrated and distributed nMOS sensor over temperature regulation system.

FIG. 9 shows an example schematic 900 showing an example n-type power MOSFET 901 having an integrated and distributed nMOS sensor over temperature regulation system. The schematic 900 shows the power MOSFET 901, one n-type MOS sensor 903 of a plurality (e.g., as shown in FIG. 1A) of MOS sensors, a current source 905, and a voltage detector and controller 907. The plurality of the n-type MOS sensors 903 can be distributed and integrated in the power MOSFET 901 as described above. A node Vo is located between the drain D of the nMOS sensor 903 and the current source 905. In some embodiments, the node Vo can be at the drain D of the nMOS sensor.

The TGATE nodes can be common between a plurality of the integrated and distributed MOS sensors 903. The Vo nodes can also be common between the plurality of integrated and distributed MOS sensors 903. The MOS sensors 903 can detect local over temperature events. When a trip temperature $T_{trip}$ is reached, a MOS sensor 903 can begin conducting, lowering the voltage at node Vo. A voltage detector 907 coupled to Vo can be configured to sense the lowered voltage at node Vo. In response, a controller can decrease the voltage at GATE to reduce and/or disable the operation of the power MOSFET 901.

Additional Details

The principles and advantages described herein can be implemented in various apparatuses. Examples of such apparatuses can include, but are not limited to, consumer electronic products, parts of the consumer electronic products, electronic test equipment, etc. Examples of parts of consumer electronic products can include clocking circuits, analog-to-digital converters, amplifiers, rectifiers, programmable filters, attenuators, variable frequency circuits, etc. Examples of the electronic devices can also include memory chips, memory modules, circuits of optical networks or other communication networks, cellular communications infrastructure such as base stations, and disk driver circuits. Consumer electronic products can include, but are not limited to, wireless devices, a mobile phone (for example, a smart phone), healthcare monitoring devices, vehicular electronics systems such as automotive electronics systems, a telephone, a television, a computer monitor, a computer, a hand-held computer, a tablet computer, a laptop computer, a personal digital assistant (PDA), a microwave, a refrigerator, a stereo system, a cassette recorder or player, a DVD player, a CD player, a digital video recorder (DVR), a VCR, an MP3 player, a radio, a camcorder, a camera, a digital camera, a portable memory chip, a washer, a dryer, a washer/dryer, a copier, a facsimile machine, a scanner, a multi-functional peripheral device, a wrist watch, a clock, etc. Further, apparatuses can include unfinished products. Further, products can include high-voltage applications such as vehicle control circuits in cars, actuators in heavy or industrial machinery, aerospace technology, etc.

Unless the context clearly requires otherwise, throughout the description and the claims, the words "comprise," "comprising," "include," "including," and the like are to be construed in an inclusive sense, as opposed to an exclusive or exhaustive sense; that is to say, in the sense of "including, but not limited to." The words "coupled" or connected", as generally used herein, refer to two or more elements that can be either directly connected, or connected by way of one or more intermediate elements. Additionally, the words "herein," "above," "below," and words of similar import, when used in this application, shall refer to this application as a whole and not to any particular portions of this application. Where the context permits, words in the Detailed Description using the singular or plural number can also include the plural or singular number, respectively. The words "or" in reference to a list of two or more items, is intended to cover all of the following interpretations of the word: any of the items in the list, all of the items in the list, and any combination of the items in the list. All numerical values provided herein are intended to include similar values within a measurement error. Some discussions of the circuit and principles may make simplifying assumptions and estimates for clarity and to improve understanding.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements, and/or states.

The teachings of the inventions provided herein can be applied to other systems, not necessarily the systems described above. The elements and acts of the various embodiments described above can be combined to provide further embodiments.

While certain embodiments of the inventions have been described, these embodiments have been presented by way of example only, and are not intended to limit the scope of the disclosure. Indeed, the novel methods and systems described herein can be embodied in a variety of other forms. Furthermore, various omissions, substitutions and changes in the form of the methods and systems described herein can be made without departing from the spirit of the disclosure. The accompanying claims and their equivalents are intended to cover such forms or modifications as would fall within the scope and spirit of the disclosure. Accordingly, the scope of the present inventions is defined by reference to the claims.

What is claimed is:

1. A power delivery system with built-in, distributed over temperature detection, the power delivery system comprising:
a power metal oxide semiconductor field effect transistor (MOSFET) on a semiconductor substrate and configured to deliver power from a power source; and
a plurality of metal oxide semiconductor (MOS) sensors distributed within an area of the semiconductor substrate outlined by the power MOSFET, the MOS sensors comprising:
a first MOS sensor having a threshold voltage configured to change conductivity based on a first temperature of a first local portion of the power MOSFET, wherein a drain of the first MOS sensor is connected to a gate of the power MOSFET and a source of the first MOS sensor is connected to a source of the power MOSFET; and
a second MOS sensor having a second threshold voltage configured to change conductivity based on a second temperature of a second local portion of the power MOSFET.

2. The power delivery system of claim 1, wherein:
each of the MOS sensors is an n-type MOS transistor, and the power MOSFET is an n-type power MOSFET.

3. The power delivery system of claim 2, further comprising:
a voltage source configured to provide a first voltage to the gate of the power MOSFET;
wherein the power MOSFET is configured to transfer power from the power source at a second voltage that is lower than the first voltage.

4. The power delivery system of claim 1, wherein:
a bias circuit configured to bias a gate of the first MOS sensor to control a trip voltage of the first MOS sensor.

5. The power delivery system of claim 4, the bias circuit comprising:
a first voltage source; and
a circuit configured to generate a threshold voltage of the first MOS sensor given a fixed temperature.

6. The power delivery system of claim 1, wherein:
the power MOSFET includes a plurality of drain regions coupled together through a metal layer; and
the drain regions are isolated from the semiconductor substrate.

7. A switch with distributed over temperature protection for local regions, the switch comprising:
a power metal oxide semiconductor field effect transistor (MOSFET) on a semiconductor substrate; and
a plurality of n-type metal oxide field effect (nMOS) transistors distributed within an area of the semiconductor substrate outlined by the power MOSFET, wherein each of the nMOS transistors has a drain that is electrically coupled to a gate of the power MOSFET, wherein the nMOS transistors are decoupled and isolated from the power MOSFET by at least one of a doped ring, an insulator ring, or a tub.

8. The switch of claim 7, wherein each of the nMOS transistors is configured to, in response to overheating of a respective local region of the power MOSFET: conduct current away from the gate of the power MOSFET and lower a voltage of the gate of the power MOSFET.

9. The switch of claim 7, wherein the power MOSFET is configured to turn off in response to one or more of the nMOS transistors reaching a trip temperature.

10. The switch of claim 7, wherein:
each of the nMOS transistors has a body that is separate from a body of the power MOSFET; and
the power MOSFET surrounds each of the nMOS transistors in an enclosed ring configuration.

11. The switch of claim 7, wherein each of the nMOS transistors has a body configured as a ring that surrounds the nMOS transistor.

12. The switch of claim 7, further comprising:
a bias network configured to set gate-source voltages ($V_{GS}$) on each of the plurality of nMOS transistors to causes a respective nMOS transistor to turn on when the respective nMOS transistor reaches a trip temperature.

13. The switch of claim 12, further comprising:
a hysteresis system configured to change a bias voltage provided to one or more of the nMOS transistors in response to detection of an overheating event.

14. The switch of claim 7, wherein:
the nMOS transistors are in separate locations within the area of the semiconductor substrate outlined by the power MOSFET such that each of the nMOS transistors are configured to independently respond to a respective temperature of a respective location around each respective nMOS transistor.

15. The switch of claim 7, wherein:
each of the nMOS transistors has a drain-source voltage ($V_{DS}$) rating that exceeds a gate-source voltage ($V_{GS}$) rating of the power MOSFET.

16. A power delivery system with built-in, distributed over temperature detection, the power delivery system comprising:
a power metal oxide semiconductor field effect transistor (MOSFET) on a semiconductor substrate and configured to deliver power from a power source; and
a plurality of metal oxide semiconductor (MOS) sensors distributed within an area of the semiconductor substrate outlined by the power MOSFET, the MOS sensors comprising:
a first MOS sensor having a threshold voltage configured to change conductivity based on a first temperature of a first local portion of the power MOSFET, wherein a source of the first MOS sensor is connected to a source of the power MOSFET; and
a second MOS sensor having a second threshold voltage configured to change conductivity based on a second temperature of a second local portion of the power MOSFET; and
a current source configured to provide a current to a drain of the first MOS sensor.

17. The power delivery system of claim 16, wherein a drain of the second MOS sensor is connected to the drain of the first MOS sensor.

18. The power delivery system of claim 16, further comprising a voltage detector and controller configured to control a voltage of a gate of the power MOSFET based on a voltage of the drain of the first MOS sensor.

19. The power delivery system of claim 1, further comprising a current source configured to provide a current to the drain of the first MOS sensor.

20. The power delivery system of claim 19, wherein a drain of the second MOS sensor is connected to the drain of the first MOS sensor.

21. The power delivery system of claim 1, wherein a drain of the second MOS sensor is connected to the drain of the first MOS sensor.

\* \* \* \* \*